(12) United States Patent
Lee et al.

(10) Patent No.: US 12,513,996 B2
(45) Date of Patent: Dec. 30, 2025

(54) THREE-DIMENSIONAL SEMICONDUCTOR DEVICE AND METHOD OF FABRICATING THE SAME

(71) Applicant: Samsung Electronics Co., Ltd., Suwon-si (KR)

(72) Inventors: Kyunghwan Lee, Suwon-si (KR); Sungil Park, Suwon-si (KR); Jae Hyun Park, Suwon-si (KR); Daewon Ha, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 638 days.

(21) Appl. No.: 17/950,434

(22) Filed: Sep. 22, 2022

(65) Prior Publication Data
US 2023/0307448 A1  Sep. 28, 2023

(30) Foreign Application Priority Data
Mar. 28, 2022 (KR) .................. 10-2022-0038366

(51) Int. Cl.
| | |
|---|---|
| H10D 88/00 | (2025.01) |
| H01L 23/522 | (2006.01) |
| H01L 23/528 | (2006.01) |
| H10D 30/01 | (2025.01) |
| H10D 30/62 | (2025.01) |
| H10D 64/01 | (2025.01) |
| H10D 84/03 | (2025.01) |

(52) U.S. Cl.
CPC ......... *H10D 88/00* (2025.01); *H01L 23/5226* (2013.01); *H01L 23/528* (2013.01); *H10D 84/038* (2025.01); *H10D 88/01* (2025.01); *H10D 30/0243* (2025.01); *H10D 30/62* (2025.01); *H10D 64/017* (2025.01)

(58) Field of Classification Search
CPC ...... H10D 88/00; H10D 88/01; H10D 84/038; H10D 30/62; H10D 64/017; H10D 30/0243; H01L 23/5226; H01L 23/528
See application file for complete search history.

(56) References Cited

U.S. PATENT DOCUMENTS

| | | |
|---|---|---|
| 10,192,819 B1 | 1/2019 | Chanemougame et al. |
| 10,304,833 B1 | 5/2019 | Suvarna et al. |
| 10,707,218 B2 | 7/2020 | Paul et al. |
| 10,770,479 B2 | 9/2020 | Smith et al. |
| 10,991,711 B2 | 4/2021 | Reznicek et al. |

(Continued)

*Primary Examiner* — Christine A Enad
(74) *Attorney, Agent, or Firm* — Fish & Richardson P.C.

(57) ABSTRACT

A three-dimensional semiconductor device comprises a first active region on a substrate and including a lower channel pattern and a lower source/drain pattern connected to the lower channel pattern, a second active region stacked on the first active region and including an upper channel pattern and an upper source/drain pattern connected to the upper channel pattern, a gate electrode on the lower channel pattern and the upper channel pattern, a first active contact electrically connected to the lower source/drain pattern, an upper separation structure between the first active contact and the upper source/drain pattern, a second active contact electrically connected to the upper source/drain pattern, and a lower separation structure between the second active contact and the lower source/drain pattern.

20 Claims, 37 Drawing Sheets

(56) References Cited

U.S. PATENT DOCUMENTS

| | | | |
|---|---|---|---|
| 11,004,856 B1 | 5/2021 | Zhang et al. | |
| 2017/0040321 A1* | 2/2017 | Mitard | B82Y 10/00 |
| 2018/0374791 A1 | 12/2018 | Smith et al. | |
| 2020/0403034 A1 | 12/2020 | Ando et al. | |
| 2020/0411430 A1 | 12/2020 | Mannebach et al. | |
| 2021/0098306 A1* | 4/2021 | Smith | H01L 21/28097 |
| 2021/0098500 A1 | 4/2021 | Wang et al. | |
| 2021/0265348 A1* | 8/2021 | Xie | H10D 88/01 |
| 2021/0366907 A1* | 11/2021 | Liao | H10D 84/038 |
| 2022/0052047 A1 | 2/2022 | Xie et al. | |

\* cited by examiner

THREE-DIMENSIONAL SEMICONDUCTOR DEVICE AND METHOD OF FABRICATING THE SAME

CROSS-REFERENCE TO RELATED APPLICATION

This U.S. nonprovisional application claims priority under 35 U.S.C. § 119 to Korean Patent Application No. 10-2022-0038366 filed on Mar. 28, 2022 in the Korean Intellectual Property Office, the disclosure of which is hereby incorporated by reference in its entirety.

BACKGROUND

The present inventive concepts relate to three-dimensional semiconductor devices and methods of fabricating the same, and more particularly, to three-dimensional semiconductor devices including one or more field effect transistors and methods of fabricating the same.

A semiconductor device includes an integrated circuit including metal oxide semiconductor field effect transistors (MOSFETs). As sizes and design rules of the semiconductor device are gradually decreased, sizes of the MOSFETs are also increasingly scaled down. The scale down of MOSFETs may deteriorate operating characteristics of the semiconductor device. Accordingly, various studies have been conducted to develop methods of fabricating semiconductor devices having superior performances while overcoming limitations caused by high integration of the semiconductor devices.

SUMMARY

Some example embodiments of the present inventive concepts provide a three-dimensional semiconductor device whose reliability is increased.

Some example embodiments of the present inventive concepts provide a method of fabricating a three-dimensional semiconductor device whose reliability is increased.

According to some example embodiments of the present inventive concepts, a three-dimensional semiconductor device may comprise: a first active region on a substrate, the first active region including a lower channel pattern and a lower source/drain pattern connected to the lower channel pattern; a second active region stacked on the first active region, the second active region including an upper channel pattern and an upper source/drain pattern connected to the upper channel pattern; a gate electrode on the lower channel pattern and the upper channel pattern; a first active contact electrically connected to the lower source/drain pattern; an upper separation structure between the first active contact and the upper source/drain pattern; a second active contact electrically connected to the upper source/drain pattern; and a lower separation structure between the second active contact and the lower source/drain pattern.

According to some example embodiments of the present inventive concepts, a three-dimensional semiconductor device may comprise: a first active region on a substrate, the first active region including a lower channel pattern and a pair of first and second lower source/drain patterns on opposite sides of the lower channel pattern; a second active region on the first active region, the second active region including an upper channel pattern and a pair of first and second upper source/drain patterns on opposite sides of the upper channel pattern; a gate electrode on the lower channel pattern and the upper channel pattern; a first active contact electrically connected to the first lower source/drain pattern; a second active contact electrically connected to the first upper source/drain pattern; a third active contact electrically connected to the second lower source/drain pattern; and a fourth active contact electrically connected to the second upper source/drain pattern. The first and second active contacts may penetrate the first upper source/drain pattern and may extend to the first lower source/drain pattern. The third and fourth active contacts may penetrate the second upper source/drain pattern and may vertically extend to the second lower source/drain pattern.

According to some example embodiments of the present inventive concepts, a three-dimensional semiconductor device may comprise: a substrate that includes an active pattern; a lower source/drain pattern on the active pattern; an upper source/drain pattern stacked on the lower source/drain pattern, the upper source/drain pattern being vertically spaced apart from the lower source/drain pattern, and the lower and upper source/drain patterns vertically overlapping each other; an interlayer dielectric layer that covers the lower and upper source/drain patterns; and first and second active contacts that vertically extend from a top surface of the interlayer dielectric layer through the upper source/drain pattern toward the lower source/drain pattern. The first active contact may be insulated from the upper source/drain pattern and may be electrically connected to the lower source/drain pattern. The second active contact may be insulated from the lower source/drain pattern and may be electrically connected to the upper source/drain pattern.

According to some example embodiments of the present inventive concepts, a method of fabricating a three-dimensional semiconductor device may comprise: forming on a substrate a first active region that includes a lower channel pattern and a lower source/drain pattern connected to the lower channel pattern; forming on the first active region a second active region that includes an upper channel pattern and an upper source/drain pattern connected to the upper channel pattern; forming a gate electrode on the lower channel pattern and the upper channel pattern; forming first and second contact holes that penetrate the upper source/drain pattern and expose the lower source/drain pattern; forming an upper separation structure on the upper source/drain pattern that is exposed by the first contact hole; forming a lower separation structure on the lower source/drain pattern that is exposed by the second contact hole; and filling the first and second contact holes with a conductive material to respectively form first and second active contacts.

DETAILED DESCRIPTION

Figure 1:
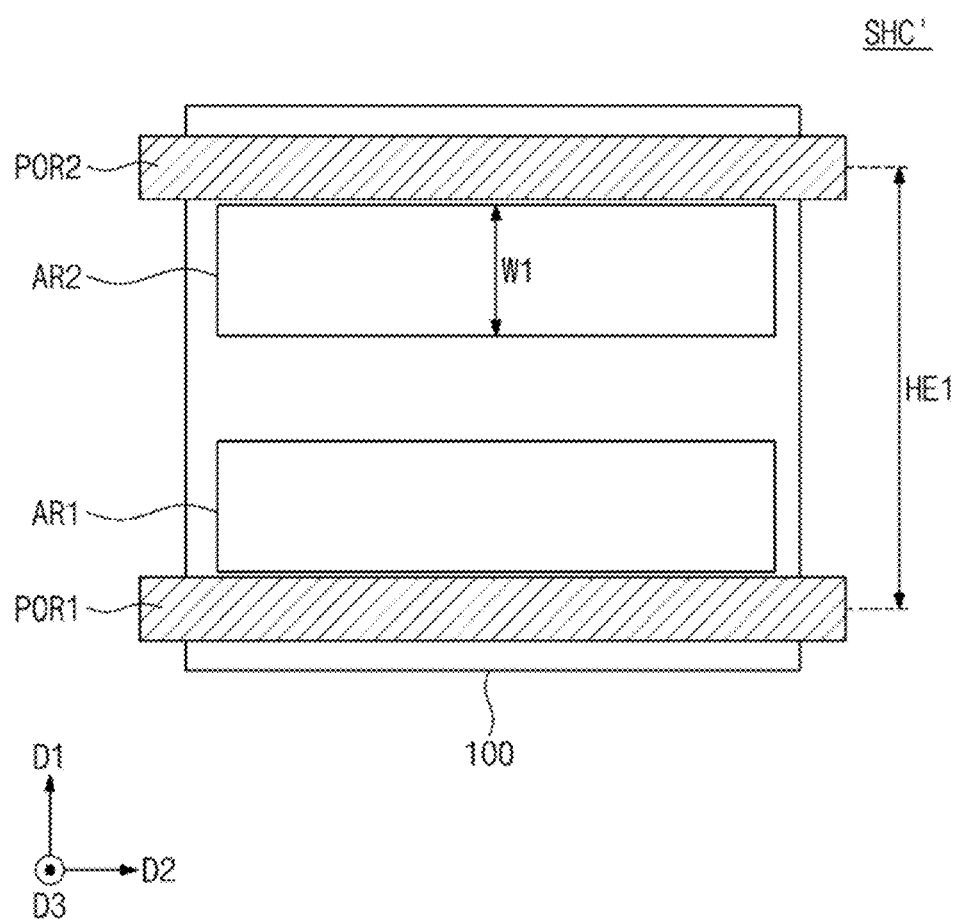
FIG. 1 illustrates a conceptual diagram showing a logic cell of a semiconductor device according to some example embodiments of the present inventive concepts.

Hereinafter, some example embodiments will be described in detail with reference to the accompanying drawings.

It will be understood that when an element is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, when an operation is described to be performed "by" performing additional operations, it will be understood that the operation may be performed "based on"

the additional operations, which may include performing said additional operations alone or in combination with other further additional operations.

As described herein, an element that is described to be "spaced apart" from another element, in general and/or in a particular direction (e.g., vertically spaced apart, laterally spaced apart, etc.) and/or described to be "separated from" the other element, may be understood to be isolated from direct contact with the other element, in general and/or in the particular direction (e.g., isolated from direct contact with the other element in a vertical direction, isolated from direct contact with the other element in a lateral or horizontal direction, etc.). Similarly, elements that are described to be "spaced apart" from each other, in general and/or in a particular direction (e.g., vertically spaced apart, laterally spaced apart, etc.) and/or are described to be "separated" from each other, may be understood to be isolated from direct contact with each other, in general and/or in the particular direction (e.g., isolated from direct contact with each other in a vertical direction, isolated from direct contact with each other in a lateral or horizontal direction, etc.).

FIG. 1 illustrates a conceptual diagram showing a logic cell of a semiconductor device according to some example embodiments of the present inventive concepts. FIG. 1 shows a logic cell of a two-dimensional device according to some example embodiments of the present inventive concepts.

Referring to FIG. 1, a single height cell SHC' may be provided. For example, a substrate 100 may be provided thereon with a first power line POR1 and a second power line POR2. One of the first and second power lines POR1 and POR2 may be provided with a drain voltage (VDD) or a power voltage. The other of the first and second power lines POR1 and POR2 may be provided with a source voltage (VSS) or a ground voltage. For example, the source voltage (VSS) may be applied to the first power line POR1, and the drain voltage (VDD) may be applied to the second power line POR2.

The single height cell SHC' may be defined between the first power line POR1 and the second power line POR2. The single height cell SHC' may include a first active region AR1 and a second active region AR2. One of the first and second active regions AR1 and AR2 may be a PMOSFET region, and the other of the first and second active regions AR1 and AR2 may be an NMOSFET region. For example, the first active region AR1 may be an NMOSFET region, and the second active region AR2 may be a PMOSFET region. For example, the single height cell SHC' may have a complementary metal oxide semiconductor (CMOS) structure provided between the first power line POR1 and the second power line POR2.

A semiconductor device according to a comparative example may be a two-dimensional device in which transistors of a front-end-of-line (FEOL) layer are arranged two-dimensionally. For example, NMOSFETs on the first active region AR1 may be formed spaced apart in a first direction D1 from PMOSFETs on the second active region AR2.

The first and second active regions AR1 and AR2 may each have a first width W1 in the first direction D1. A first height HE1 may be defined to indicate a length in the first direction D1 of the single height cell SHC' according to a comparative example. The first height HE1 may be substantially the same as a distance (e.g., pitch) between the first power line POR1 and the second power line POR2.

The single height cell SHC' may constitute one logic cell. In this description, the logic cell may mean a logic device, such as AND, OR, XOR, XNOR, and inverter, that performs a specific function. For example, the logic cell may include transistors for constituting a logic device, and may also include wiring lines that connect the transistors to each other.

Because a two-dimensional device is included in the single height cell SHC' according to a comparative example, the first active region AR1 and the second active region AR2 may be disposed spaced apart from each other in the first direction D1 without overlapping each other. Therefore, it may be required that the first height HE1 of the single height cell SHC' be defined to include all of the first and second active regions AR1 and AR2 that are spaced apart from each other in the first direction D1. As a result, the first height HE1 of the single height cell SHC' according to a comparative example may be required to become relatively large. Therefore, the single height cell SHC' according to a comparative example may have a relatively large area.

Figure 2:
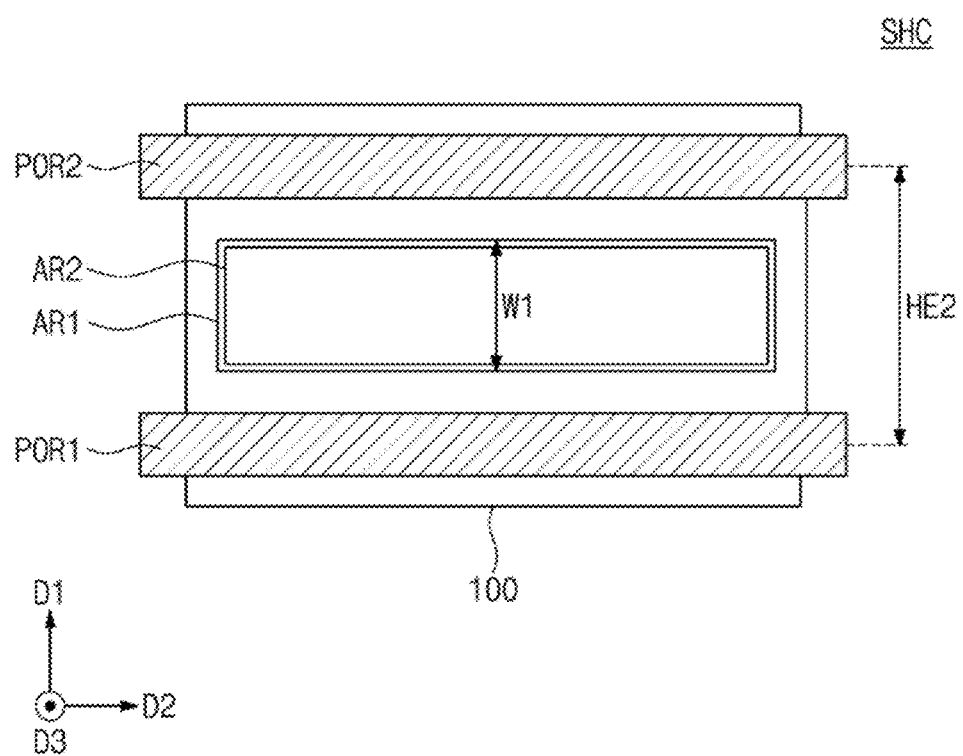
FIG. 2 illustrates a conceptual view showing a logic cell of a semiconductor device according to some example embodiments of the present inventive concepts.

FIG. 2 illustrates a conceptual view showing a logic cell of a semiconductor device according to some example embodiments of the present inventive concepts. FIG. 2 depicts a logic cell of a three-dimensional device according to some example embodiments of the present inventive concepts.

Referring to FIG. 2, a single height cell SHC may be provided which includes a three-dimensional device such as a stacked transistor. For example, a substrate 100 may be provided thereon with a first power line POR1 and a second power line POR2. The single height cell SHC may be defined between the first power line POR1 and the second power line POR2.

The single height cell SHC may include a first active region AR1 and a second active region AR2. One of the first and second active regions AR1 and AR2 may be a PMOSFET region, and the other of the first and second active regions AR1 and AR2 may be an NMOSFET region.

A semiconductor device according to some example embodiments may be a three-dimensional device in which transistors of a front-end-of-line (FEOL) layer are stacked vertically (e.g., stacked in a vertical direction, which may be the third direction D3). The substrate 100 may be provided thereon with the first active region AR1 as a bottom tier, and the first active region AR1 may be provided thereon with the second active region AR2 as a top tier. For example, the substrate 100 may be provided thereon with NMOSFETs of the first active region AR1, and the NMOSFETs may be provided thereon with PMOSFETs of the second active region AR2. The first active region AR1 and the second active region AR2 may be spaced apart from each other in a vertical direction or a third direction D3.

The first and second active regions AR1 and AR2 may each have a first width W1 in the first direction D1. A second height HE2 may be defined to indicate a length in the first direction D1 of the single height cell SHC according to some example embodiments.

Because the single height cell SHC according to some example embodiments includes a three-dimensional device or a stacked transistor, the first and second active regions AR1 and AR2 may overlap each other. Therefore, the second height HE2 of the single height cell SHC may have a size enough to cover the first width W1. As a result, the second height HE2 of the single height cell SHC according to some example embodiments may be less that the first height HE1 of the single height cell SHC' discussed above in FIG. 1. For example, the single height cell SHC according to some example embodiments may have a relatively small area. For a three-dimensional semiconductor device according to some example embodiments, an area of a logic cell may be reduced to increase integration of the device.

Figure 3:
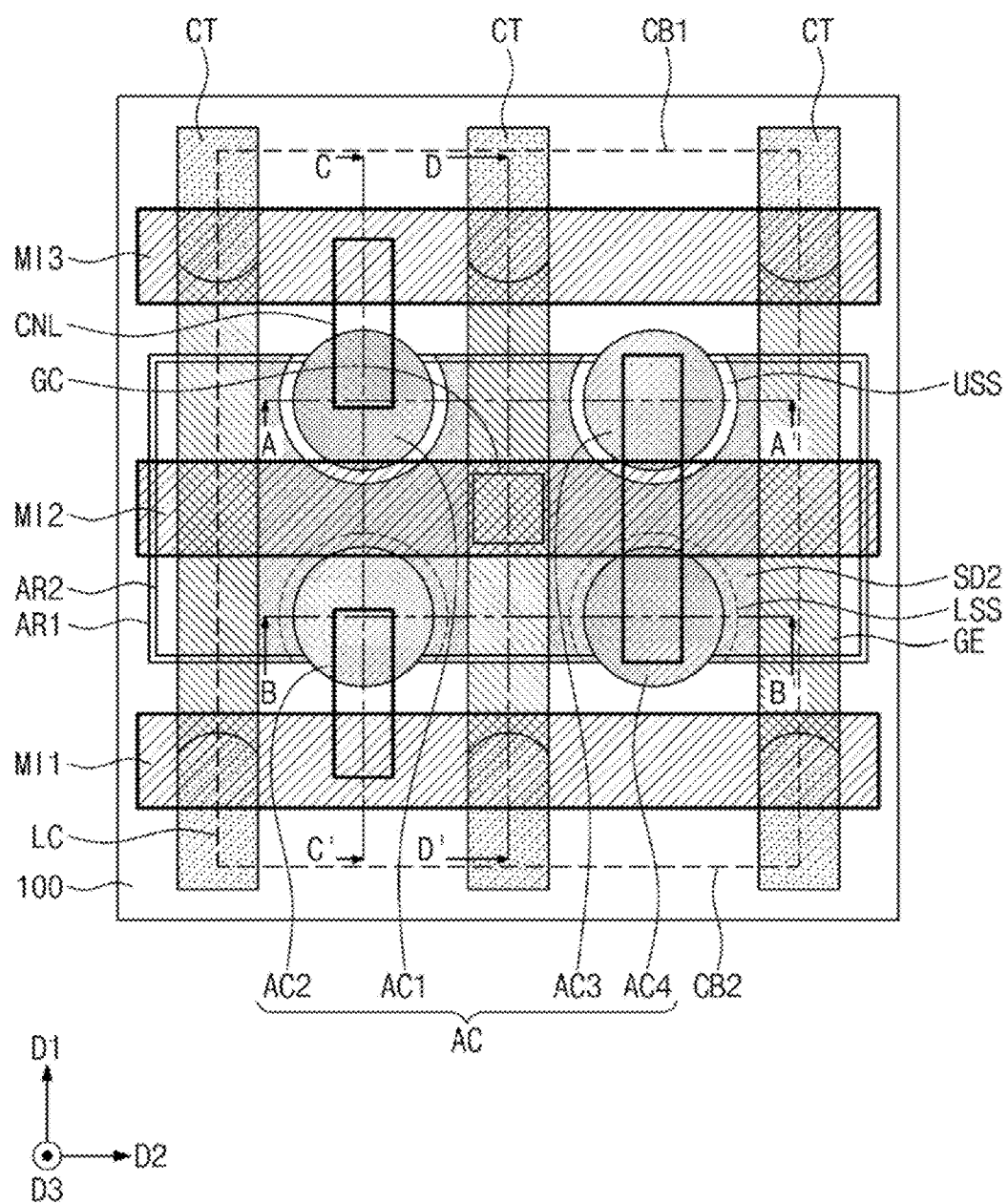
FIG. 3 illustrates a plan view showing a three-dimensional semiconductor device according to some example embodiments of the present inventive concepts.

FIG. 3 illustrates a plan view showing a three-dimensional semiconductor device according to some example embodiments of the present inventive concepts. FIGS. 4A, 4B, 4C, and 4D illustrate cross-sectional views respectively taken along lines A-A', B-B', C-C', and D-D' of FIG. 3. A three-dimensional semiconductor device shown in FIGS. 3 and 4A to 4D may be a detailed example of the single height cell depicted in FIG. 2.

Referring to FIGS. 3 and 4A to 4D, a logic cell LC may be provided on a substrate 100. The substrate 100 may be a compound semiconductor substrate or a semiconductor substrate including silicon, germanium, or silicon-germanium. For example, the substrate 100 may be a silicon substrate.

The logic cell LC may include a first active region AR1 and a second active region AR2 that are sequentially stacked on the substrate 100. One of the first and second active regions AR1 and AR2 may be a PMOSFET region, and the other of the first and second active regions AR1 and AR2 may be an NMOSFET region. The first active region AR1 may be provided on a bottom tier of a front-end-of-line (FEOL) layer, and the second active region AR2 may be provided on a top tier of the front-end-of-line (FEOL) layer. An NMOSFET of the first active region AR1 and a PMOSFET of the second active region AR2 may be vertically stacked to constitute a three-dimensional stacked transistor. In some example embodiments, the first active region AR1 may be an NMOSFET region, and the second active region AR2 may be PMOSFET region.

An active pattern AP may be defined by a trench TR formed on an upper portion of the substrate 100. The active pattern AP may be a vertically protruding portion of the substrate 100. When viewed in plan, the active pattern AP may have a bar shape that extends in a second direction D2. The active pattern AP may be provided thereon with the first and second active regions AR1 and AR2 that are sequentially stacked.

The trench TR may be filled with a device isolation layer ST. The device isolation layer ST may include a silicon oxide layer. The device isolation layer ST may have a top surface coplanar with or lower than that of the active pattern AP. The device isolation layer ST may not cover any of lower and upper channel patterns CH1 and CH2 which will be discussed below.

The active pattern AP may be provided thereon with the first active region AR1 that includes a low channel pattern CH1 and a pair of lower source/drain patterns SD1. The lower channel pattern CH1 may be interposed between the pair of lower source/drain patterns SD1. The lower channel pattern CH1 may connect the pair of lower source/drain patterns SD1 to each other.

The lower channel pattern CH1 may include first, second, and third semiconductor patterns SP1, SP2, and SP3 that are sequentially stacked. The first, second, and third semiconductor patterns SP1, SP2, and SP3 may be spaced apart from each other in a vertical direction or a third direction D3. The first, second, and third semiconductor patterns SP1, SP2, and SP3 may each include one or more of silicon (Si), germanium (Ge), and silicon-germanium (SiGe). For example, each of the first, second, and third semiconductor patterns SP1, SP2, and SP3 may include crystalline silicon.

The lower source/drain patterns SD1 may be provided on the top surface of the active pattern AP. Each of the lower source/drain patterns SD1 may be an epitaxial pattern formed by a selective epitaxial growth process. For example, the lower source/drain pattern SD1 may have a top surface higher than that of the third semiconductor pattern SP3 included in the lower channel pattern CH1.

The lower source/drain patterns SD1 may be doped with impurities to have a first conductivity type. The first conductivity type may be an n-type or p-type. In some example embodiments, the first conductivity type may be an n-type. The lower source/drain patterns SD1 may include one or more of silicon (Si) and silicon-germanium (SiGe).

A first interlayer dielectric layer 110 may be provided on the lower source/drain patterns SD1. The first interlayer dielectric layer 110 may cover the lower source/drain patterns SD1. The first interlayer dielectric layer 110 may be provided thereon with a second interlayer dielectric layer 120 and the second active region AR2.

The second active region AR2 may include an upper channel pattern CH2 and a pair of upper source/drain patterns SD2. The upper channel pattern CH2 may vertically overlap the lower channel pattern CH1. The upper source/drain patterns SD2 may vertically overlap corresponding lower source/drain patterns SD1. The upper channel pattern CH2 may be interposed between the pair of upper source/drain patterns SD2. The upper channel pattern CH2 may connect the pair of upper source/drain patterns SD2 to each other.

The upper channel pattern CH2 may include fourth, fifth, and sixth semiconductor patterns SP4, SP5, and SP6 that are vertically stacked. The fourth, fifth, and sixth semiconductor patterns SP4, SP5, and SP6 may be spaced apart from each other in the third direction D3. The fourth, fifth, and sixth semiconductor patterns SP4, SP5, and SP6 included in the upper channel pattern CH2 may include the same semiconductor material as that of the first, second, and third semiconductor patterns SP1, SP2, and SP3 included in the lower channel pattern CH1.

At least one dummy channel pattern DSP may be interposed between the lower channel pattern CH1 and the upper channel pattern CH2 that overlies the lower channel pattern CH1. The dummy channel pattern DSP may be spaced apart from the lower source/drain patterns SD1. The dummy channel pattern DSP may be spaced apart from the upper source/drain patterns SD2. For example, the dummy channel pattern DSP may not be connected to any of source/drain patterns. The dummy channel pattern DSP may include a semiconductor material such as silicon (Si), germanium (Ge), or silicon-germanium (SiGe), or may include a silicon-based dielectric material such as silicon oxide or silicon nitride. In some example embodiments of the present inventive concepts, the dummy channel pattern DSP may include a silicon-based dielectric material.

The upper source/drain patterns SD2 may be provided on a top surface of the first interlayer dielectric layer 110. Each of the upper source/drain patterns SD2 may be an epitaxial pattern formed by a selective epitaxial growth (SEG) process. For example, the upper source/drain pattern SD2 may have a top surface higher than that of the sixth semiconductor pattern SP6 included in the upper channel pattern CH2.

The upper source/drain patterns SD2 may be doped with impurities to have a second conductivity type. The second conductivity type may be different from the first conductivity type of the lower source/drain patterns SD1. The second conductivity type may be a p-type. The upper source/drain patterns SD2 may include one or more of silicon (Si) and silicon-germanium (SiGe).

The second interlayer dielectric layer 120 may cover the upper source/drain patterns SD2. The second interlayer dielectric layer 120 may have a top surface coplanar with that of each of first and second active contacts AC1 and AC2 which will be discussed below.

A plurality of gate electrodes GE may be provided on the logic cell LC. For example, the gate electrode GE may be provided on the lower and upper channel patterns CH1 and CH2 that are stacked. When viewed in plan, the gate electrode GE may have a bar shape that extends in a first direction D1. The gate electrode GE may vertically overlap the lower and upper channel patterns CH1 and CH2 that are stacked.

The gate electrode GE may extend in a vertical direction (or the third direction D3) from the top surface of the device isolation layer ST (or the top surface of the active pattern AP) to a gate capping pattern GP which will be discussed below. The gate electrode GE may extend in the third direction D3 from the lower channel pattern CH1 of the first active region AR1 toward the upper channel pattern CH2 of the second active region AR2. The gate electrode GE may extend in the third direction D3 from the first semiconductor pattern SP1 at bottom toward the sixth semiconductor pattern SP6 at top.

The gate electrode GE may be provided on a top surface, a bottom surface, and opposite sidewalls of each of the first to sixth semiconductor patterns SP1 to SP6. In this sense, a transistor according to some example embodiments may be a three-dimensional field effect transistor (e.g., MBCFET or GAAFET) in which the gate electrode GE three-dimensionally surrounds the lower and upper channel patterns CH1 and CH2.

The gate electrode GE may include a lower gate electrode LGE provided in a bottom tier of a front-end-of-line (FEOL) layer or in the first active region AR1, and may also include an upper gate electrode UGE provided in a top tier of the FEOL layer or in the second active region AR2. The lower gate electrode LGE and the upper gate electrode UGE may vertically overlap each other. The lower gate electrode LGE and the upper gate electrode UGE may be connected to each other. For example, the gate electrode GE according to some example embodiments may be a common gate electrode in which the lower gate electrode LGE on the lower channel pattern CH1 is connected to the upper gate electrode UGE on the upper channel pattern CH2.

The lower gate electrode LGE may include a first portion PO1 interposed between the active pattern AP and the first semiconductor pattern SP1, a second portion PO2 interposed between the first semiconductor pattern SP1 and the second semiconductor pattern SP2, a third portion PO3 interposed between the second semiconductor pattern SP2 and the third semiconductor pattern SP3, and a fourth portion PO4 interposed between the third semiconductor pattern SP3 and the dummy channel pattern DSP.

The upper gate electrode UGE may include a fifth portion PO5 interposed between the dummy channel pattern DSP and the fourth semiconductor pattern SP4, a sixth portion PO6 interposed between the fourth semiconductor pattern SP4 and the fifth semiconductor pattern SP5, a seventh portion PO7 interposed between the fifth semiconductor pattern SP5 and the sixth semiconductor pattern SP6, and an eighth portion PO8 on the sixth semiconductor pattern SP6.

Figure 4A:
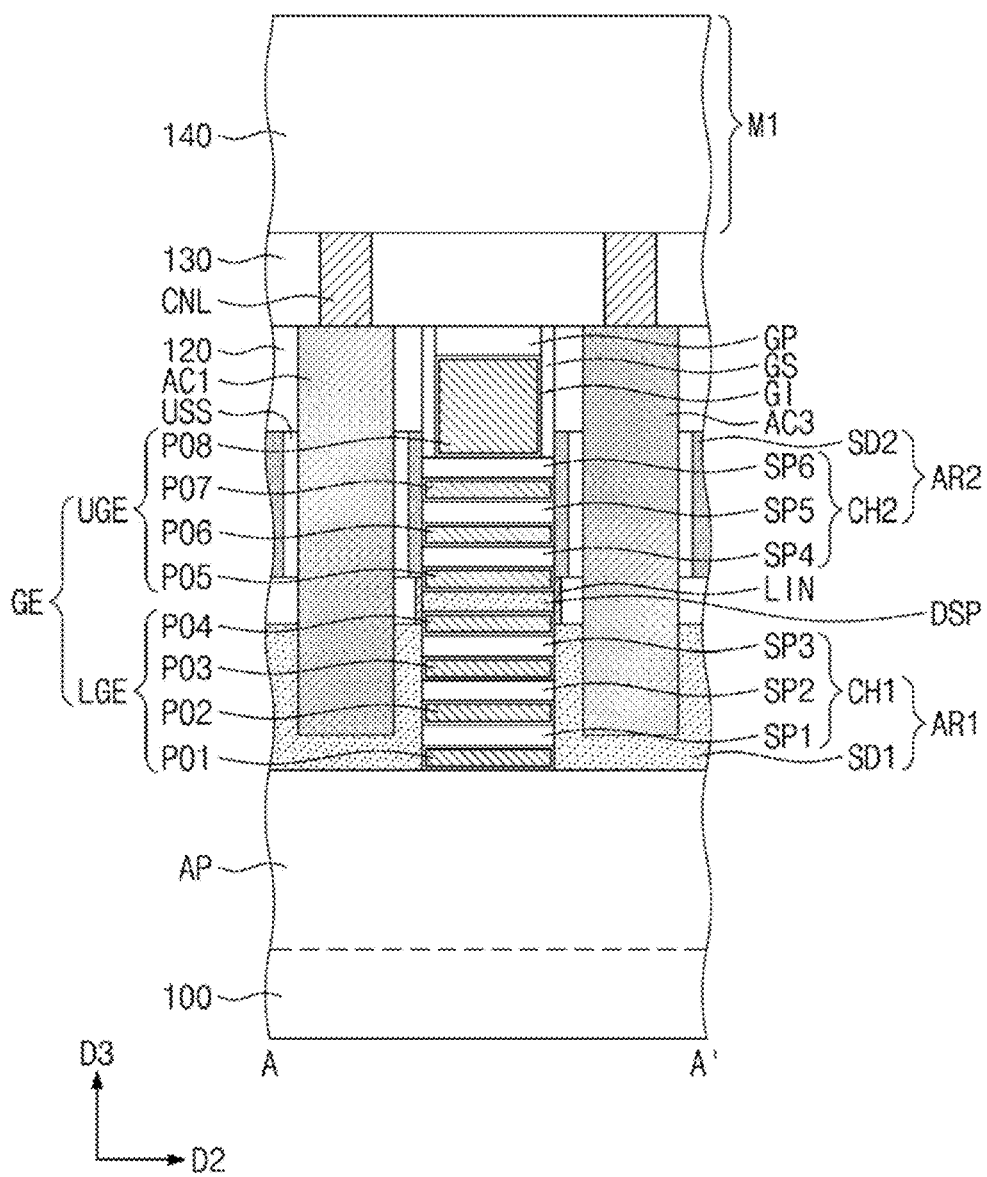
FIGS. 4A, 4B, 4C, and 4D illustrate cross-sectional views respectively taken along lines A-A', B-B', C-C', and D-D' of FIG. 3.

A pair of gate spacers GS may be disposed on opposite sidewalls of the gate electrode GE. Referring to FIG. 4A, a pair of gate spacers GS may be disposed on opposite sidewalls of the eighth portion PO8. The gate spacers GS may extend in the first direction D1 along the gate electrode GE. The gate spacers GS may have their top surfaces higher than that of the gate electrode GE. The top surfaces of the gate spacers GS may be coplanar with that of the second interlayer dielectric layer 120. The gate spacers GS may include at least one selected from SiCN, SiCON, and SiN. Alternatively, the gate spacers GS may each include a multiple layer formed of at least two selected from SiCN, SiCON, and SiN. A pair of liner layers LIN may be provided on opposite sidewalls of each of the third and fourth portions PO3 and PO4 of the gate electrode GE.

A gate capping pattern GP may be provided on the top surface of the gate electrode GE. The gate capping pattern GP may extend in the first direction D1 along the gate electrode GE. For example, the gate capping pattern GP may include at least one selected from SiON, SiCN, SiCON, and SiN.

A gate dielectric layer GI may be interposed between the gate electrode GE and each of the first to sixth semiconductor patterns SP1 to SP6. The gate dielectric layer GI may include one or more of a silicon oxide layer, a silicon oxynitride layer, and a high-k dielectric layer. In some example embodiments of the present inventive concepts, the gate dielectric layer GI may include a silicon oxide layer that covers surfaces of the first to sixth semiconductor patterns SP1 to SP6, and may also include a high-k dielectric layer on the silicon oxide layer. For example, the gate dielectric layer GI may include a multiple layer of a silicon oxide layer and a high-k dielectric layer.

The high-k dielectric layer may include a high-k dielectric material whose dielectric constant is greater than that of a silicon oxide layer. For example, the high-k dielectric material may include at least one selected from hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

The lower gate electrode LGE may include a first work-function metal pattern on the first, second, and third semiconductor patterns SP1, SP2, and SP3. The upper gate electrode UGE may include a second work-function metal pattern on the fourth, fifth, and sixth semiconductor patterns SP4, SP5, and SP6. Each of the first and second work-function metal patterns may include nitrogen (N) and at least one metal selected from titanium (Ti), tantalum (Ta), aluminum (Al), tungsten (W), and molybdenum (Mo). The first and second work-function metal patterns may have different work-functions from each other. The gate electrode GE may include a low-resistance metal (e.g., at least one selected from tungsten (W), ruthenium (Ru), aluminum (Al), titanium (Ti), and tantalum (Ta)) on the first and second work-function metal patterns.

Referring back to FIG. 3, the logic cell LC according to some example embodiments may include a first cell boundary CB1 that is defined to extend in the second direction D2. On a location opposite to that of the first cell boundary CB1, a second cell boundary CB2 may be defined to extend in the second direction D2. Gate cutting patterns CT may be correspondingly disposed on the first and second cell boundaries CB1 and CB2.

The gate cutting pattern CT may penetrate the gate electrode GE. The gate cutting pattern CT may separate the gate electrode GE from another gate electrode that is adjacent in the first direction D1 to the gate electrode GE. For example, referring to FIG. 4D, a pair of gate cutting patterns CT may be provided on opposite ends of the gate electrode GE. The gate cutting patterns CT may include a dielectric material, such as a silicon oxide layer, a silicon nitride layer, or a combination thereof.

A gate contact GC may be provided to penetrate a third interlayer dielectric layer 130 and the gate capping pattern GP and to electrically connect to the gate electrode GE. The gate contact GC may include metal selected from copper (Cu), aluminum (Al), ruthenium (Ru), cobalt (Co), tungsten (W), and molybdenum (Mo).

Active contacts AC1 to AC4, collectively referred to as active contacts AC, may be provided to electrically connected to the lower and upper source/drain patterns SD1 and SD2. For example, referring to FIG. 3, a first active contact AC1 and a second active contact AC2 may be provided adjacent to one side of the gate electrode GE. A third active contact AC3 and a fourth active contact AC4 may be provided adjacent to another side of the gate electrode GE. For example, first to fourth active contacts AC1 to AC4 may include a doped semiconductor and/or metal. The metal may include at least one selected from copper (Cu), aluminum (Al), ruthenium (Ru), cobalt (Co), tungsten (W), and molybdenum (Mo).

The first to fourth active contacts AC1 to AC4 may extend from the top surface of the second interlayer dielectric layer 120 through the upper source/drain patterns SD2 to the lower source/drain patterns SD1. In some example embodiments of the present inventive concepts, the first to fourth active contacts AC1 to AC4 may have their bottom surfaces located at the same or substantially same level. For example, the respective bottom surfaces of the first to fourth active contacts AC1 to AC4 may be coplanar. For example, the first to fourth active contacts AC1 to AC4 may be formed to have substantially the same depth. The bottom surfaces of the first to fourth active contacts AC1 to AC4, which may be at a same or substantially same level, may be between the top and bottom surfaces (e.g., between the respective levels of the top and bottom surfaces in the third direction D3) of the lower source/drain pattern SD1, for example as shown in at least FIGS. 4A-4B.

In the present specification, the term 'level', 'depth', or the like may mean a vertical height measured from a plane or surface at a reference location (e.g., the bottom or top surface of the substrate 100, the top surface of the device isolation layer ST, the top surface of the active pattern AP, etc.) in a direction perpendicular to the plane or surface at the reference location (e.g., a direction perpendicular to the bottom or top surface of the substrate 100, the top surface of the device isolation layer ST, the top surface of the active pattern AP, etc.), for example, a distance from the reference location in the third direction D3. In the present specification, the term 'width' may mean a width (or length) measured in a direction parallel to the plane or surface at the reference location (e.g., the bottom or top surface of the substrate 100), for example in the first direction D1 and/or the second direction D2.

Figure 4B:
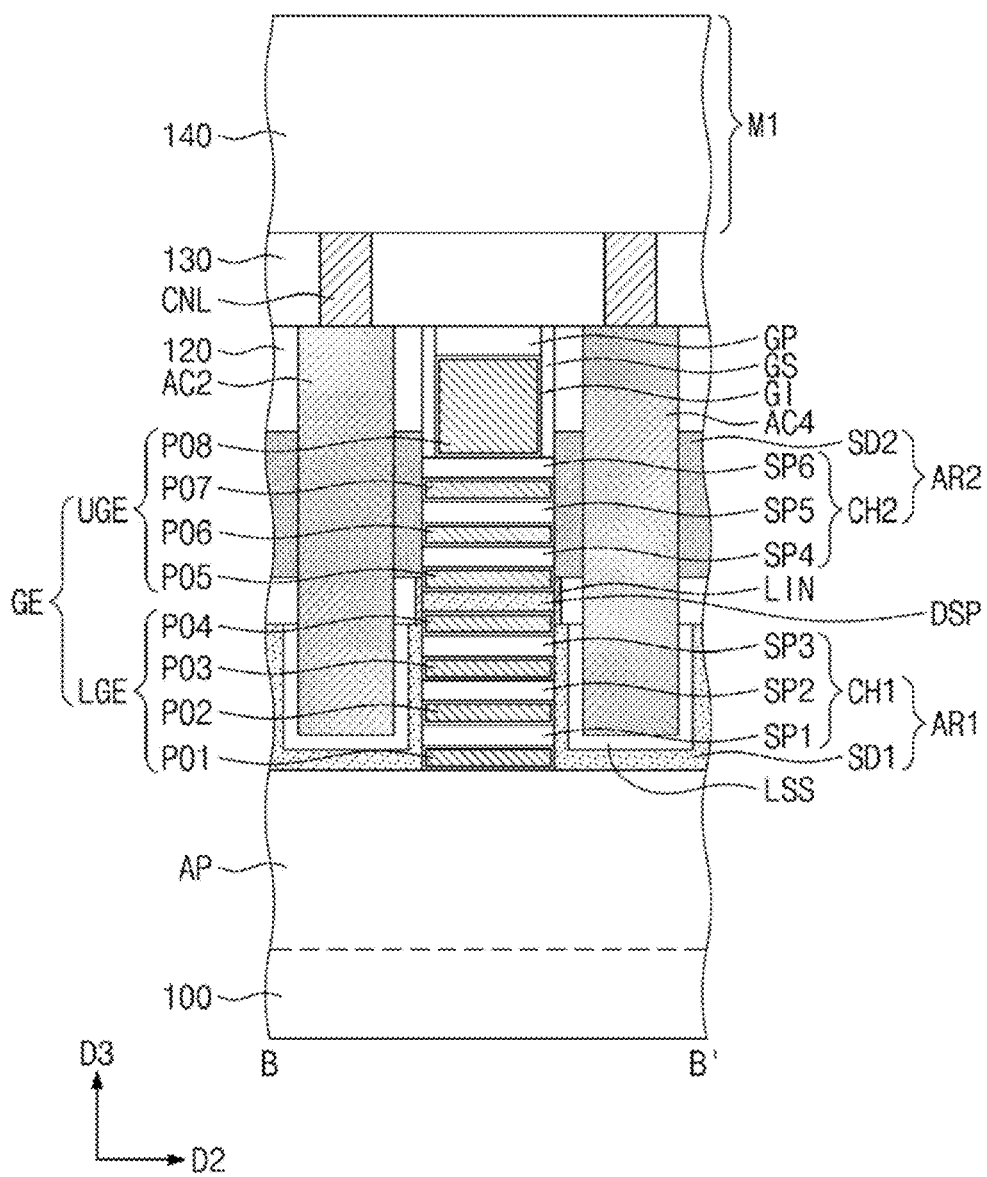
Figure 4C:
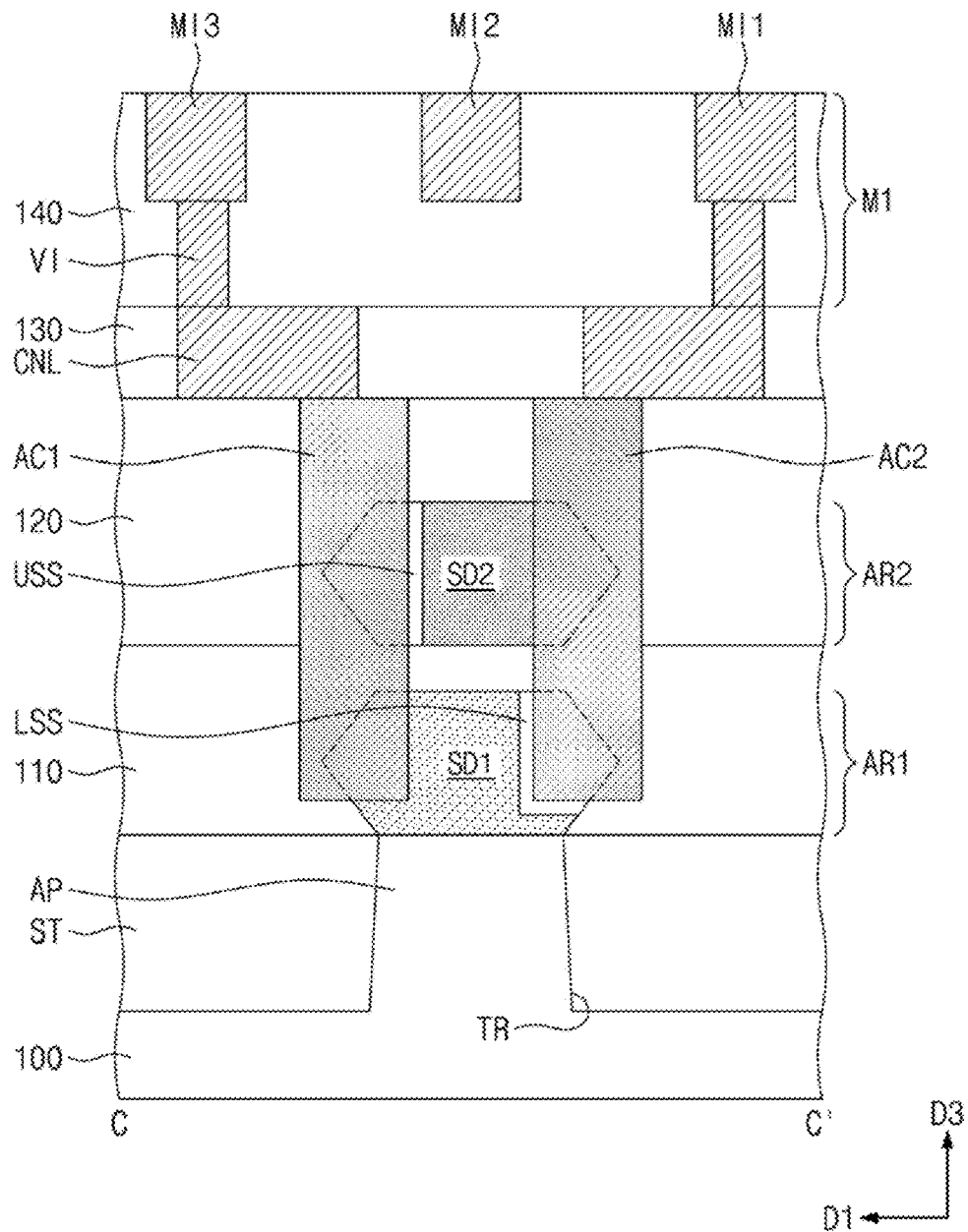

In some example embodiments, the third direction D3 may be referred to as a vertical direction extending perpendicular to a reference plane or surface, for example extending perpendicular to the bottom or top surface of the substrate 100, the top surface of the device isolation layer ST, the top surface of the active pattern AP, etc., as shown in at least FIGS. 4A-4C. IN some example embodiments, the first direction D1 and the second direction D2 may each be referred to as extending perpendicular to the vertical direction (e.g., third direction) and thus may extend in parallel to the reference plane or surface, for example extending parallel to the bottom or top surface of the substrate 100, the top surface of the device isolation layer ST, the top surface of the active pattern AP, etc., as shown in at least FIGS. 4A-4C.

Additionally, as shown, the first and second directions D1 and D2 may be referred to as extending perpendicular to each other.

Referring to FIGS. 3 and 4C, the first active contact AC1 and the second active contact AC2 may be provided between neighboring gate electrodes GE. The lower source/drain pattern SD1 and the upper source/drain pattern SD2 may be stacked between neighboring gate electrodes GE. The first and second active contacts AC1 and AC2 may commonly penetrate the stacked lower and upper source/drain patterns SD1 and SD2. The first and second active contacts AC1 and AC2 may be provided on opposite sides of the lower source/drain pattern SD1. The first and second active contacts AC1 and AC2 may be provided on opposite sides of the upper source/drain pattern SD2. The first and second active contacts AC1 and AC2 may be adjacent to each other in the second direction D2.

The first active contact AC1 may be electrically connected only to the lower source/drain pattern SD1, but not to the upper source/drain pattern SD2. The second active contact AC2 may be electrically connected only to the upper source/drain pattern SD2, but not to the lower source/drain pattern SD1.

For example, an upper separation structure USS may be provided between the first active contact AC1 and the upper source/drain pattern SD2. The upper separation structure USS may cover a sidewall of the first active contact AC1. The upper separation structure USS may cause the first active contact AC1 not to contact with but to separate from the upper source/drain pattern SD2. For example, the upper separation structure USS may isolate (e.g., may be configured to isolate) the first active contact AC1 from contact (e.g., direct contact) with the upper source/drain pattern SD2. The first active contact AC1 may be coupled to the lower source/drain pattern SD1.

A lower separation structure LSS may be provided between the second active contact AC2 and the lower source/drain pattern SD1. The lower separation structure LSS may cover a sidewall and a bottom surface of the second active contact AC2. The lower separation structure LSS may cause the second active contact AC2 not to contact with but to separate from the lower source/drain pattern SD1. For example, the lower separation structure LSS may isolate (e.g., may be configured to isolate) the second active contact AC2 from contact (e.g., direct contact) with the lower source/drain pattern SD1. The second active contact AC2 may be coupled to the upper source/drain pattern SD2.

Referring back to FIGS. 3 and 4A to 4D, the third and fourth active contacts AC3 and AC4 between neighboring gate electrodes GE may commonly penetrate the lower and upper source/drain patterns SD1 and SD2 that are stacked. The upper separation structure USS may allow the third active contact AC3 to electrically connect only to the lower source/drain pattern SD1, but not to the upper source/drain pattern SD2. The lower separation structure LSS may allow the fourth active contact AC4 to electrically connect only to the upper source/drain pattern SD2, but not to the lower source/drain pattern SD1.

According to some example embodiments of the present inventive concepts, the first to fourth active contacts AC1 to AC4 that are two-dimensionally arranged may be correspondingly coupled to four source/drain terminals of stacked NMOSFET and PMOSFET. For example, the first active contact AC1 may be coupled to a source terminal of a lower NMOSFET, the second active contact AC2 may be coupled to a source terminal of an upper PMOSFET, the third active contact AC3 may be coupled to a drain terminal of the lower NMOSFET, and the fourth active contact AC4 may be coupled to a drain terminal of the upper PMOSFET.

Figure 5:
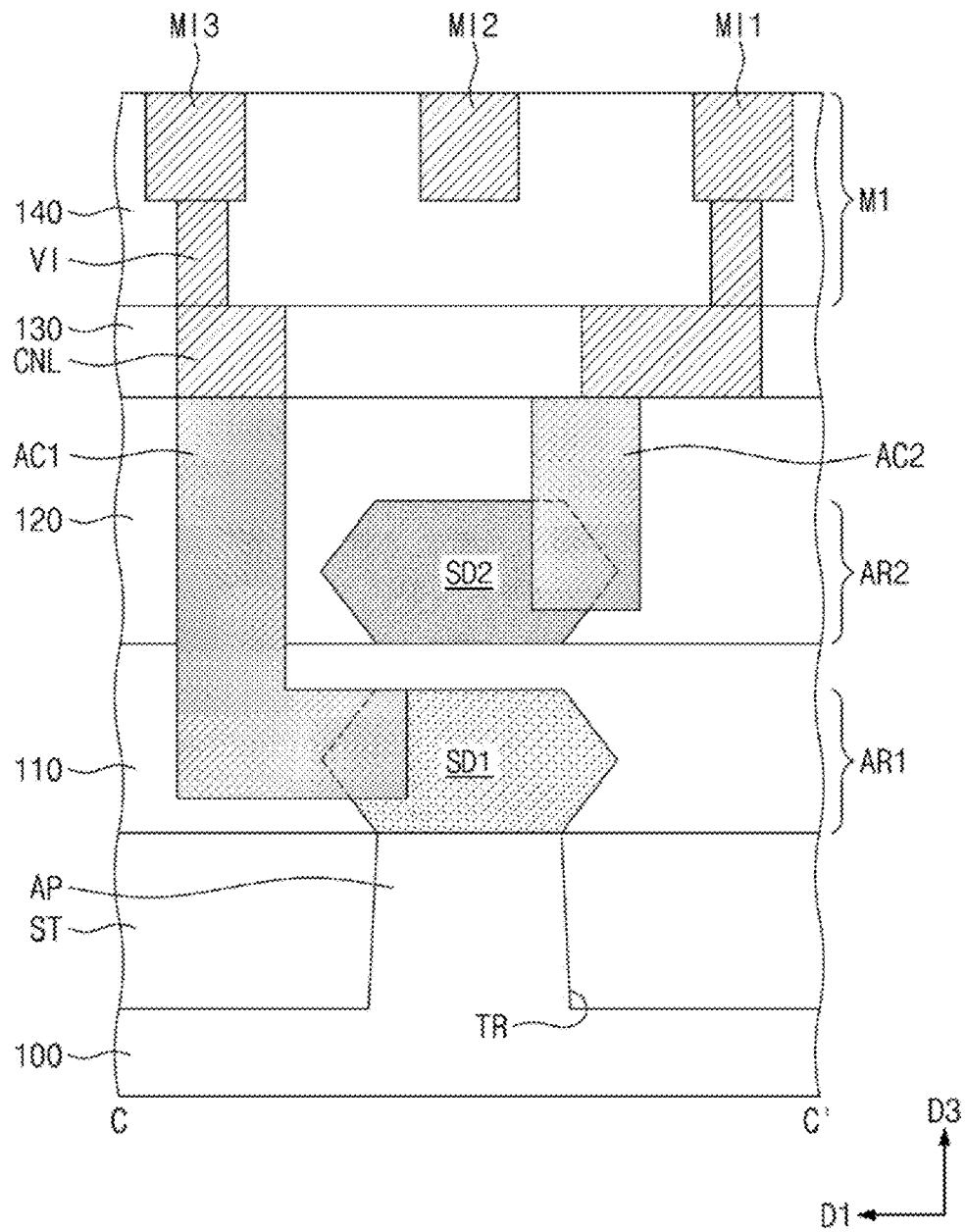
FIG. 5 illustrates a cross-sectional view taken along line C-C' of FIG. 3, showing a three-dimensional semiconductor device according to some example embodiments of the present inventive concepts.

FIG. 5 illustrates a cross-sectional view taken along line C-C' of FIG. 3, showing a three-dimensional semiconductor device according to some example embodiments of the present inventive concepts. Referring to FIG. 5, the first active contact AC1 may be formed to have an L shape so as to be coupled to the lower source/drain pattern SD1 without being in contact with the upper source/drain pattern SD2. The second active contact AC2 may be formed to have a small depth so as to be coupled to the upper source/drain pattern SD2 without being in contact with the lower source/drain pattern SD1.

According to a comparative example, the first and second active contacts AC1 and AC2 may be formed to have asymmetrical structures with each other to be correspondingly coupled to the lower and upper source/drain patterns SD1 and SD2 that are stacked. For example, it is required that the first active contact AC1 be formed to have an L shape, and this may induce an increase in process difficulty and a reduction in device reliability.

In contrast, according to some example embodiments of the present inventive concepts, the first to fourth active contacts AC1 to AC4 may have their (e.g., respective) pillar shapes that extend in the same third direction D3 (e.g., the vertical direction). As shown, each pillar shape, also known as a pillar structure, of each of the active contacts may be symmetrical (e.g., radially symmetrical around a longitudinal axis of the respective active contact). The first to fourth active contacts AC1 to AC4 may be formed to have the same diameter and the same depth. In the present inventive concepts, the upper separation structure USS and the lower separation structure LSS may be used such that the first to fourth active contacts AC1 to AC4 may be one-to-one connected to four lower and upper source/drain patterns SD1 and SD2. As a result, in comparison with the comparative example of FIG. 5, the present inventive concepts may induce a reduction in process difficulty (e.g., improved ease of manufacture of a three-dimensional semiconductor device) and a marked increase in device reliability.

Figure 4D:
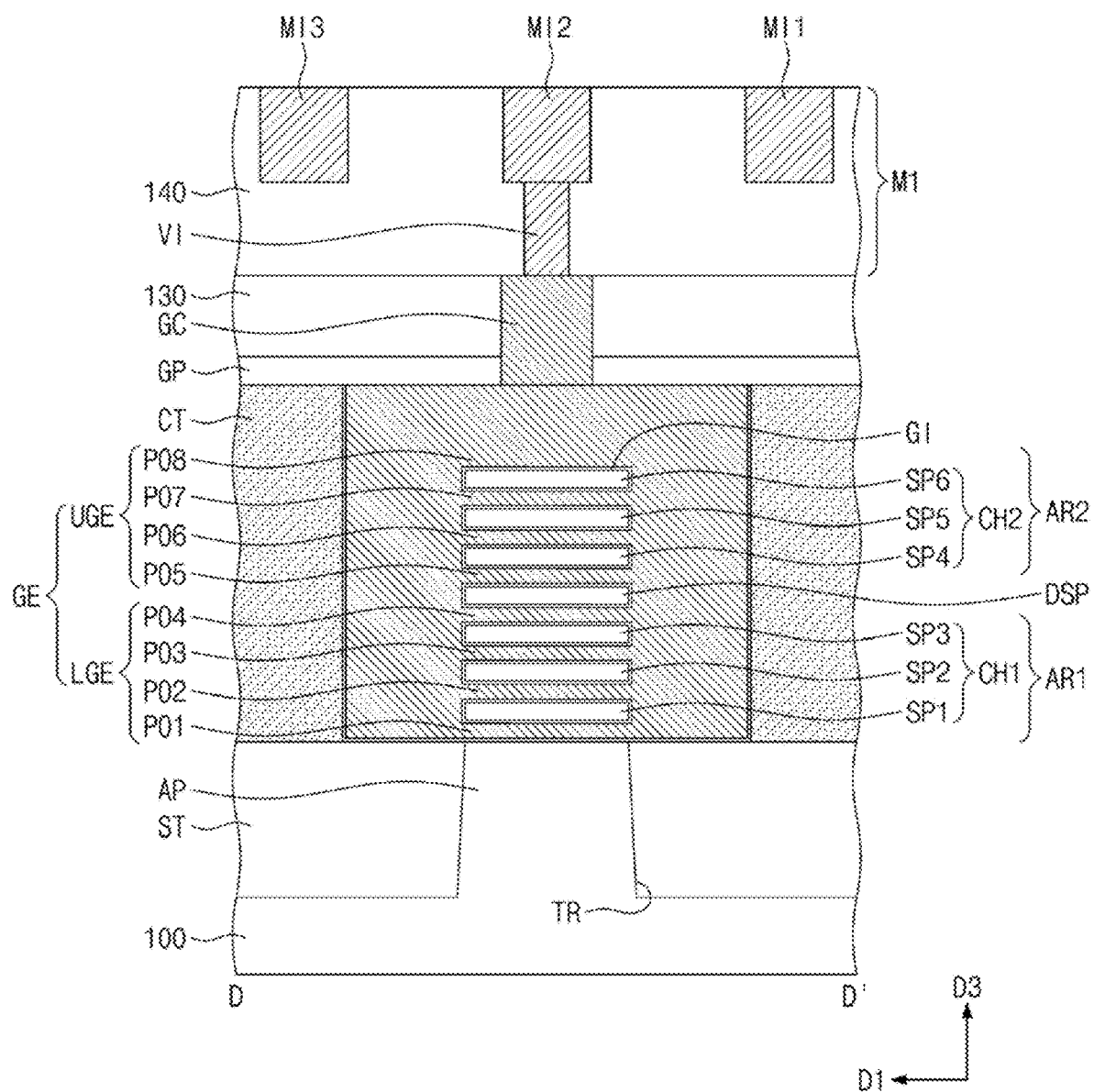

For example, in the three-dimensional semiconductor device according to some example embodiments, including for example the example embodiments shown in at least FIGS. 3 to 4D, the upper and lower separation structures USS and LSS, each being between at least one active contact and a particular source/drain pattern of the upper or lower source/drain patterns SD2 or SD1, may enable a three-dimensional semiconductor device to include at least two active contacts (e.g., the first to fourth active contacts AC1 to AC4) that may extend vertically through the elevations occupied by at least a portion of each of the vertically-stacked upper and lower source/drain patterns SD2 and SD1 and are connected to (e.g., in direct contact with, electrically connected with, etc.) one source/drain pattern of the upper or lower source/drain patterns SD2 or SD1 and are not connected to (e.g., isolated from direct contact with, isolated from electrical connection with, insulated from, electrically insulated from, etc.) another one source/drain pattern of the lower or upper source/drain patterns SD1 or SD2, while enabling the at least two active contacts to have a same or substantially same shape, which may be a symmetrical shape (e.g., the first to fourth active contacts AC1 to AC4 having a same or substantially same pillar shape having a same diameter and depth between same respective top surface and bottom surface levels, the reliability of the three-dimensional semiconductor device may be improved based on the upper and lower separation structures USS and LSS enabling the at least two active contacts to each be connected to one of the lower or upper source/drain patterns SD1 or SD2 and to not be connected to another of the lower or upper source/drain patterns SD1 or SD2, while also improving ease of manufacture of the three-dimensional semiconductor device based on the active contacts having a same (e.g., symmetrical) shape, for example in relation to manufacturing asymmetrical contacts (e.g., first and second active contacts AC1 and AC2 in the comparative example shown in FIG. 5). For example, based on the three-dimensional semiconductor device having active contacts with a same (e.g., symmetrical) shape, the complexity of the method of manufacturing the three-dimensional semiconductor device may be reduced in relation to a method of manufacturing a three-dimensional semiconductor device having different and/or asymmetrically shaped active contacts that are each connected to one source/drain pattern and are collectively connected to upper and lower source drain pattern while each being connected to one and not another of the upper/lower source/drain patterns. As a result, the likelihood of manufacturing defects resulting from manufacture of the three-dimensional semiconductor device according to the inventive concepts may be reduced in relation to manufacturing different and/or asymmetrically shaped active contacts that are each connected to one source/drain pattern and are collectively connected to upper and lower source drain pattern while each being connected to one and not another of the upper/lower source/drain patterns may be reduced, thereby improving the reliability of manufactured three-dimensional semiconductor devices according to the inventive concepts.

A third interlayer dielectric layer 130 may be provided on the second interlayer dielectric layer 120. A fourth interlayer dielectric layer 140 may be provided on a third interlayer dielectric layer 130. In some example embodiments, connection lines CNL may be provided in the third interlayer dielectric layer 130. The connection lines CNL may be correspondingly provided on the first to fourth active contacts AC1 to AC4.

A first metal layer M1 may be provided in the fourth interlayer dielectric layer 140. The first metal layer M1 may include first, second, and third wiring lines MI1, MI2, and MI3 that are sequentially arranged along the first direction D1. The first, second, and third wiring lines MI1, MI2, and MI3 may extend in parallel to each other in the second direction D2. The first, second, and third lines MI1, MI2, and MI3 may include metal selected from copper (Cu), aluminum (Al), ruthenium (Ru), cobalt (Co), tungsten (W), and molybdenum (Mo). In some example embodiments, the first and third wiring lines MI1 and MI3 may be the first and second power lines POR1 and POR2 discussed above with reference to FIG. 2.

The first metal layer M1 may further include vias VI provided thereunder. At least one selected from the first, second, and third wiring lines MI1, MI2, and MI3 may be electrically connected through the via VI and the connection line CNL to at least one selected from the first to fourth active contacts AC1 to AC4 (see FIG. 4C). Another of the first, second, and third wiring lines MI1, MI2, and MI3 may be electrically connected through the via VI to the gate contact GC (see FIG. 4D).

Additional metal layers (e.g., M2, M3, M4, etc.) may be stacked on the first metal layer M1. The first metal layer M1 and other metal layers (e.g., M2, M3, M4, etc.) on the first metal layer M1 may constitute a back-end-of-line (BEOL) layer of a semiconductor device. The metal layers (e.g., M2, M3, M4, etc.) on the first metal layer M1 may include routing lines for connecting logic cells to each other.

Figure 14A:
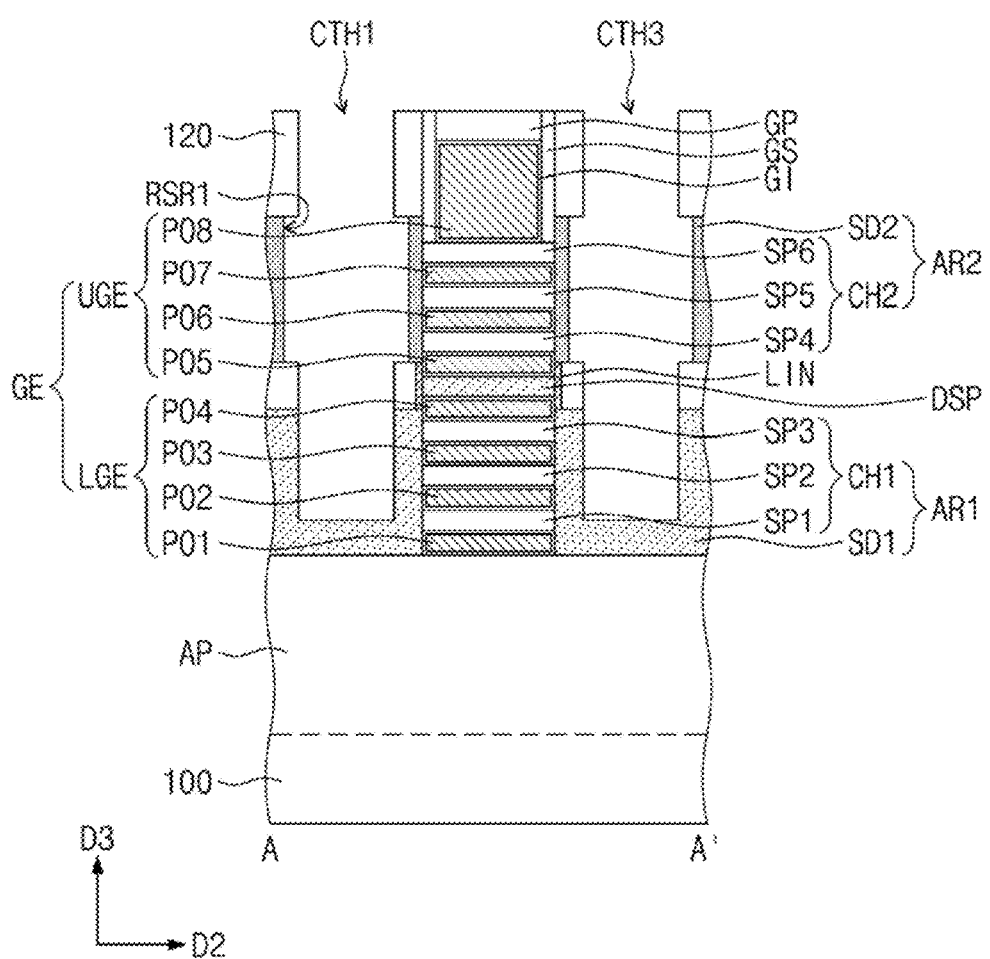
Figure 14B:
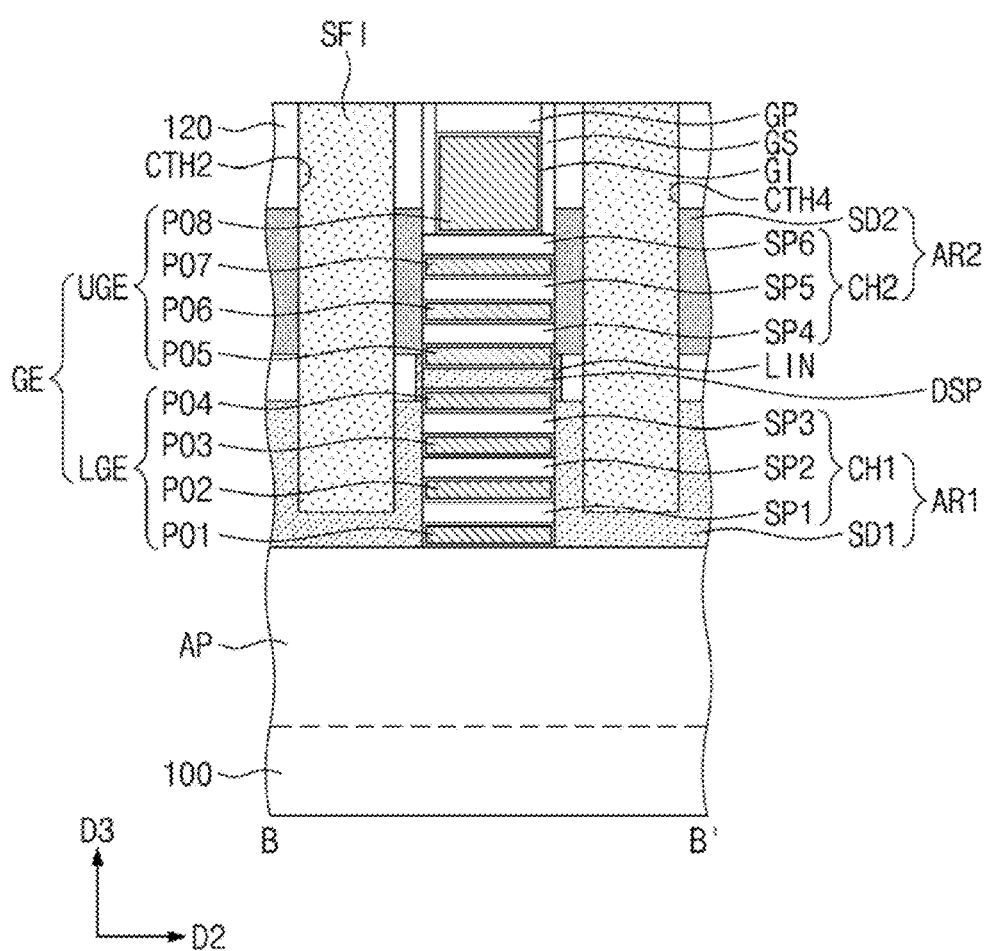
Figure 14C:
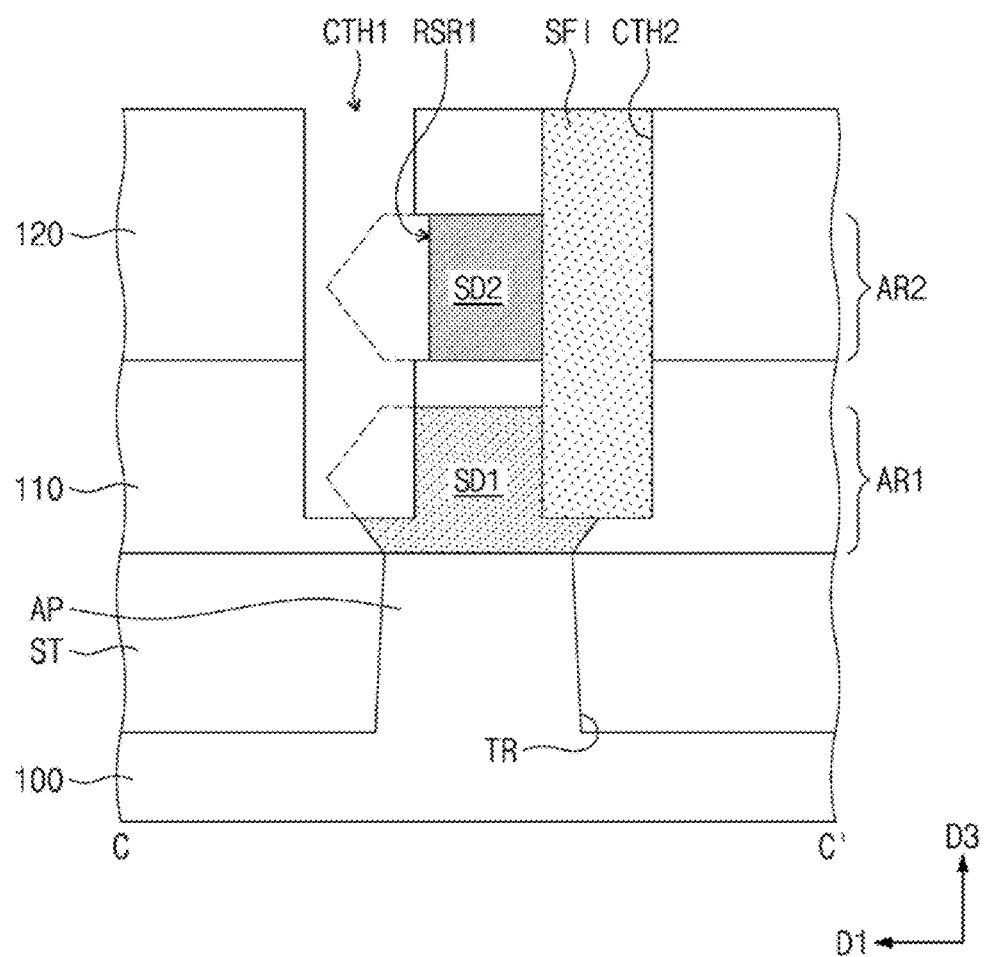
Figure 15A:
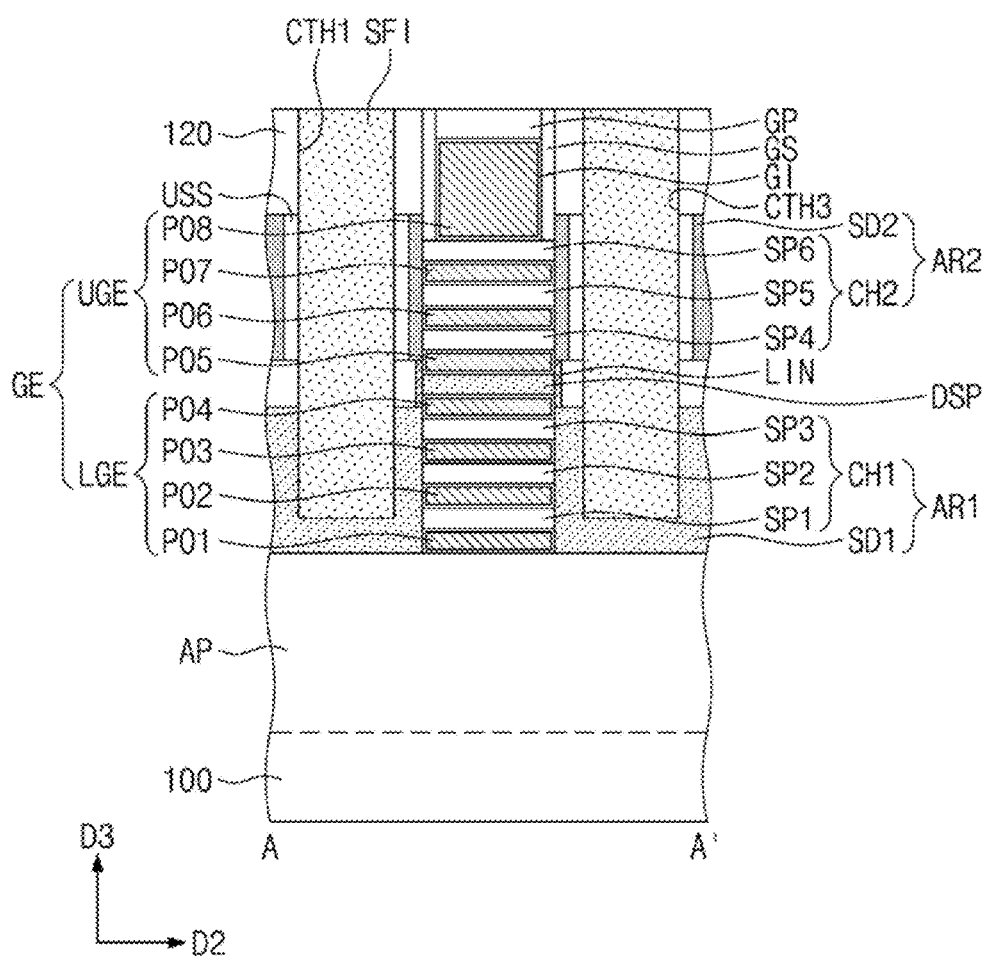
Figure 15B:
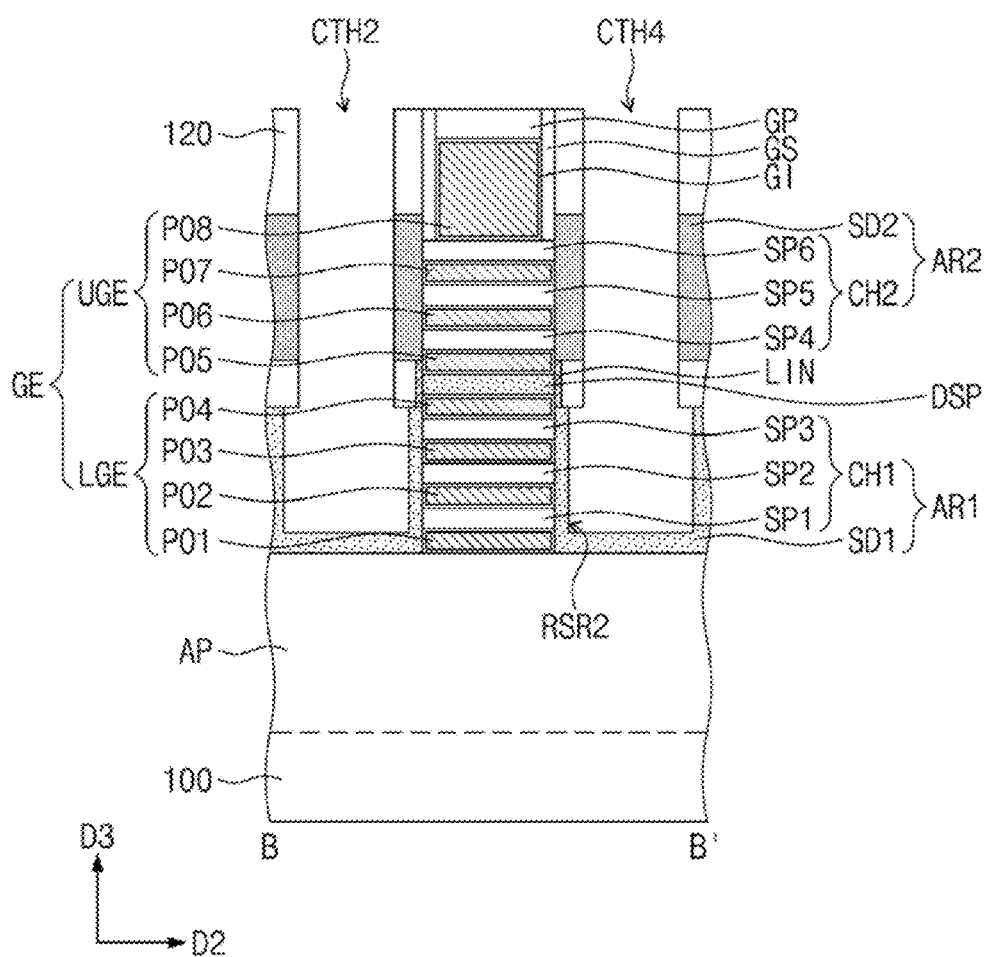
Figure 15C:
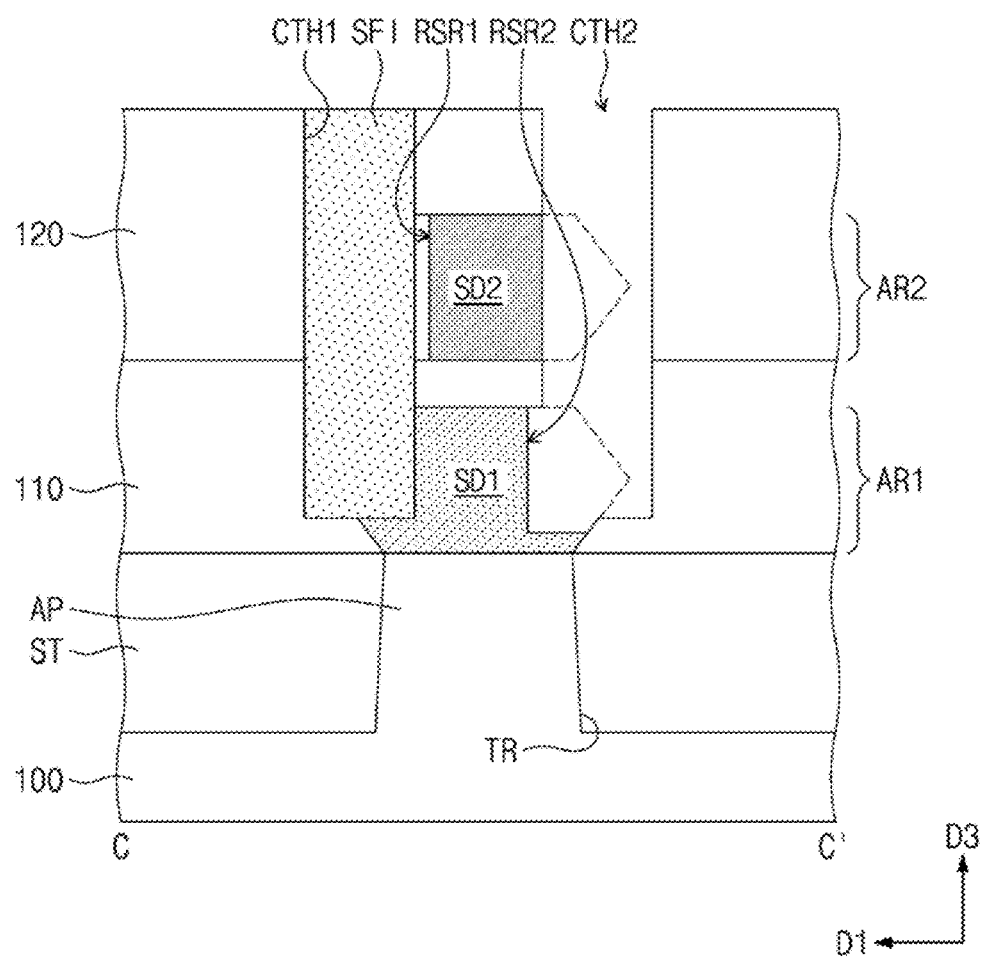
Figure 16A:
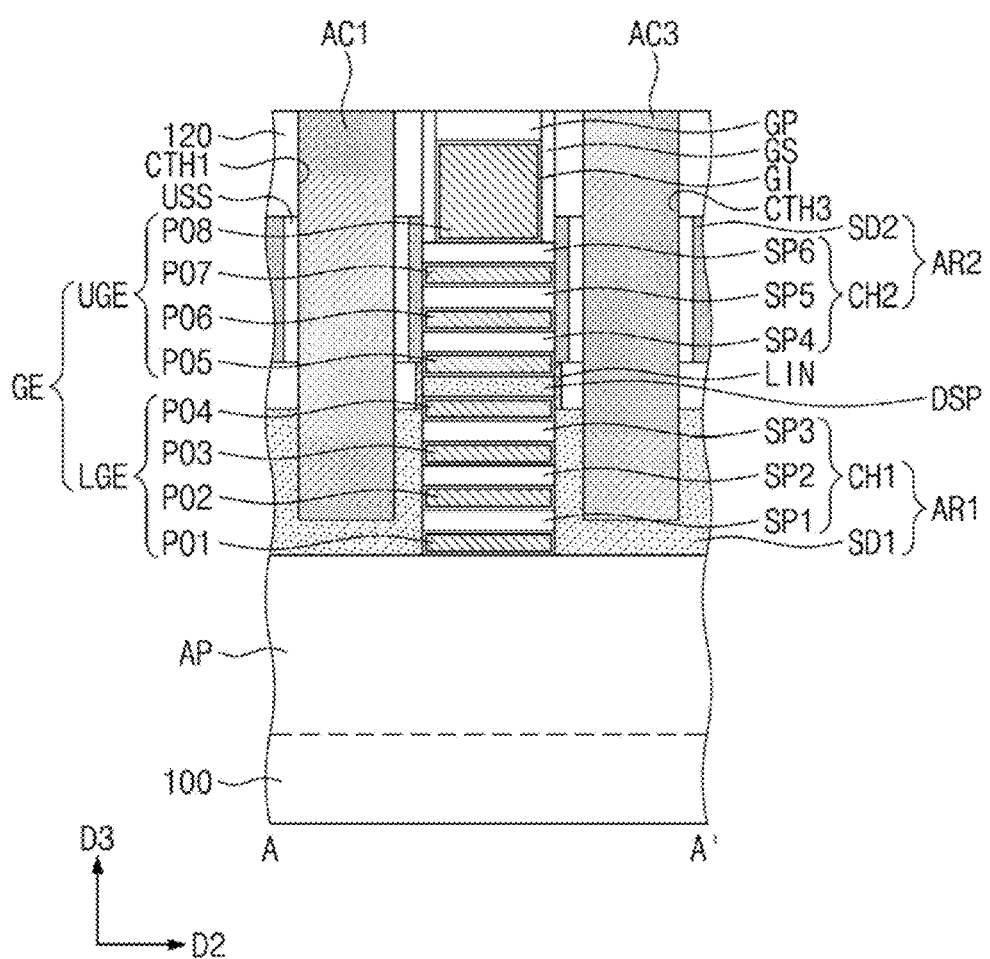
Figure 16B:
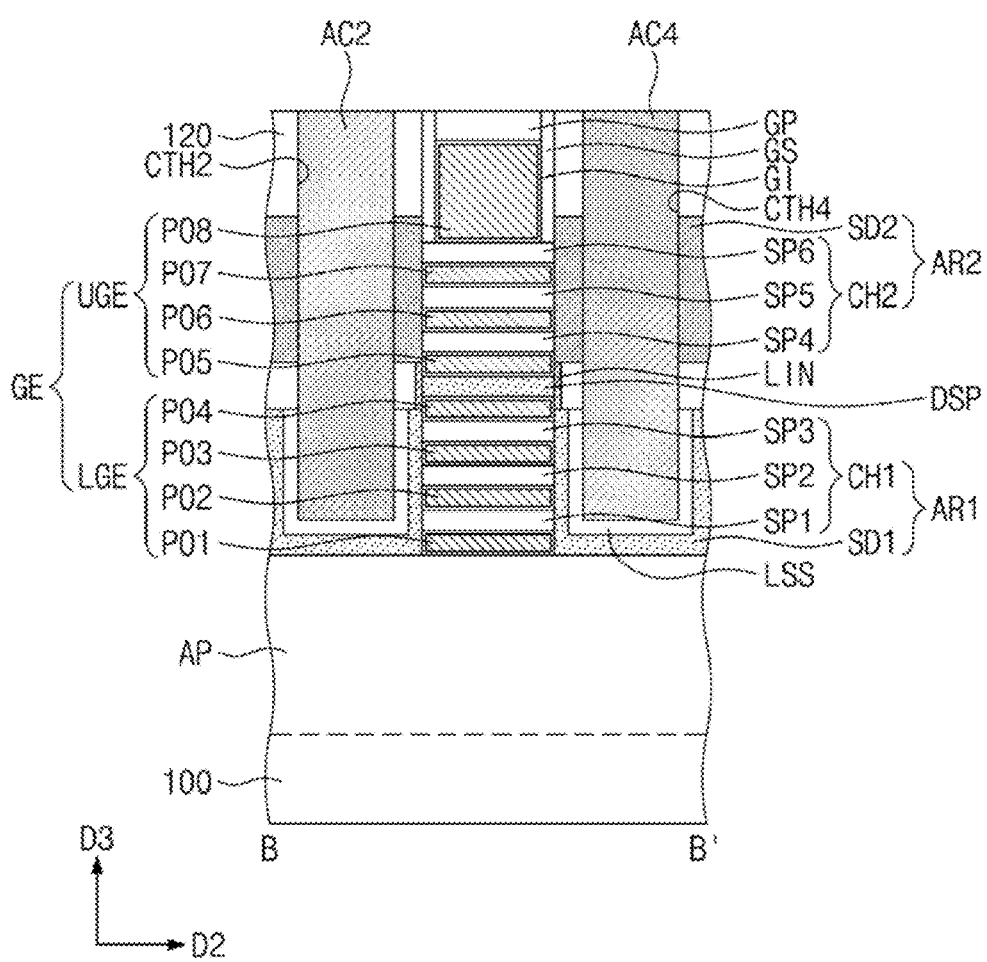
Figure 16C:
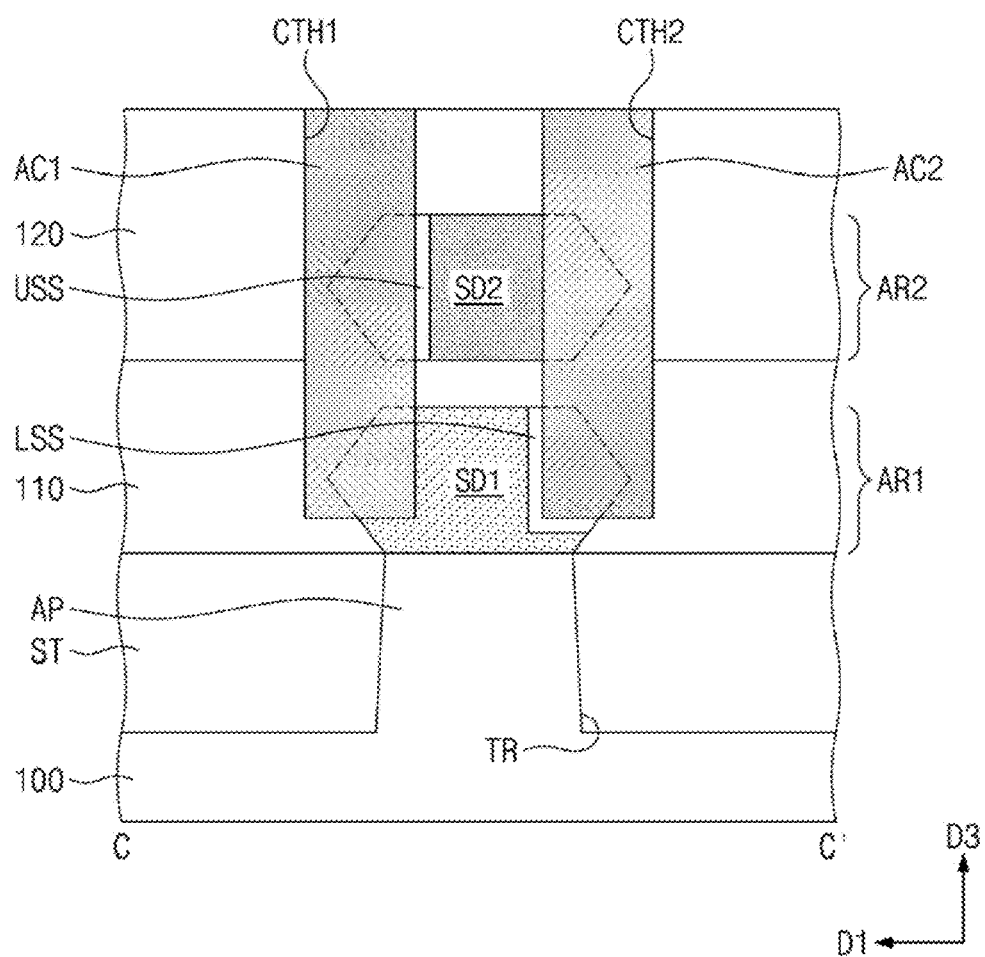

FIGS. 6A, 6B, 7A, 7B, 8A, 8B, 9A, 9B, 10A, 10B, 11A, 11B, 12A, 12B, 13A, 13B, 14A, 14B, 14C, 15A, 15B, 15C, 16A, 16B, and 16C illustrate cross-sectional views showing a method of fabricating a semiconductor device according to some example embodiments of the present inventive concepts. FIGS. 6A, 7A, 8A, 9A, 10A, 11A, 12A, 13A, 14A, 15A, and 16A illustrate cross-sectional views corresponding to line A-A' of FIG. 3. FIGS. 14B, 15B, and 16B illustrate cross-sectional views corresponding to line B-B' of FIG. 3. FIGS. 8B, 9B, 10B, 13B, 14C, 15C, and 16C illustrate cross-sectional views corresponding to line C-C' of FIG. 3. FIGS. 6B, 7B, 11B, and 12B illustrate cross-sectional views corresponding to line D-D' of FIG. 3.

Figure 6A:
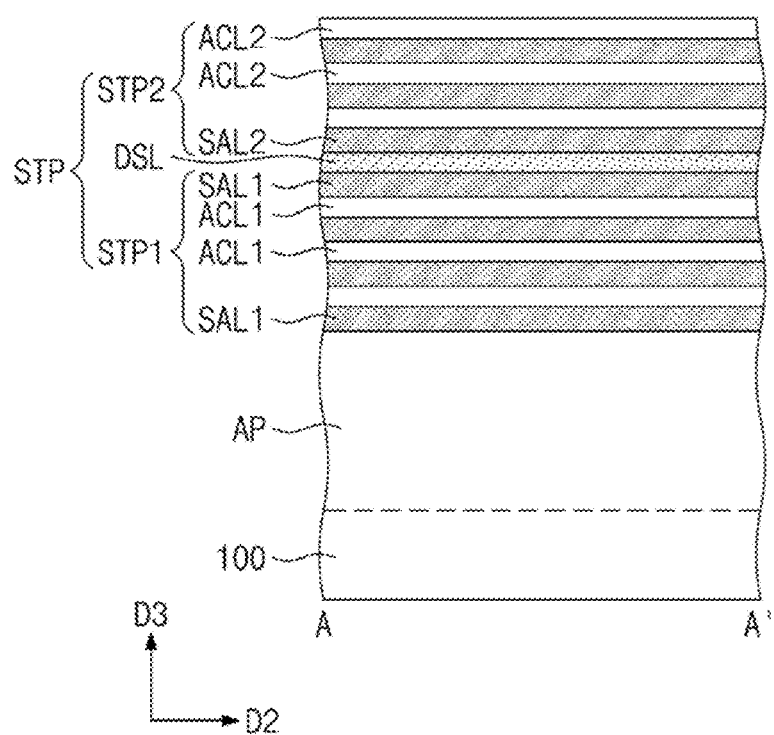
FIGS. 6A, 6B, 7A, 7B, 8A, 8B, 9A, 9B, 10A, 10B, 11A, 11B, 12A, 12B, 13A, 13B, 14A, 14B, 14C, 15A, 15B, 15C, 16A, 16B, and 16C illustrate cross-sectional views showing a method of fabricating a semiconductor device according to some example embodiments of the present inventive concepts.
Figure 6B:
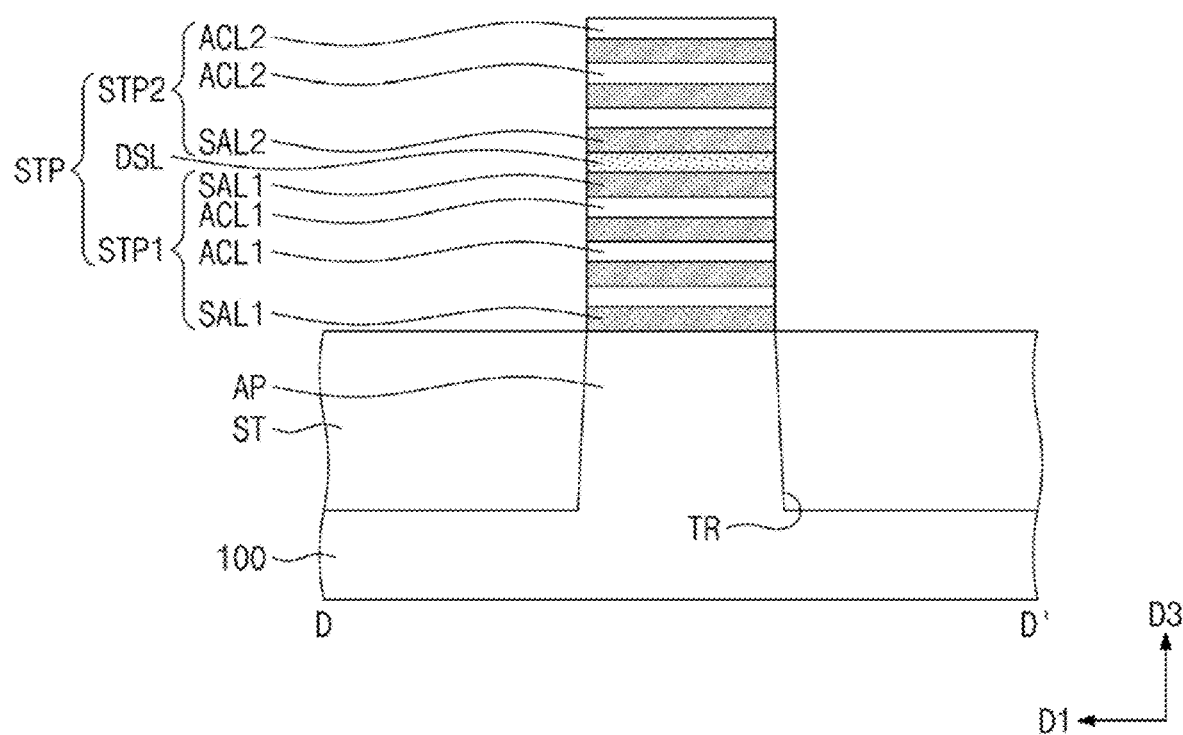

Referring to FIGS. 6A and 6B, first sacrificial layers SAL1 and first active layers ACL1 may be alternately stacked on a substrate 100. The first sacrificial layers SAL1 may include one of silicon (Si), germanium (Ge), and silicon-germanium (SiGe), and the first active layers ACL1 may include another of silicon (Si), germanium (Ge), and silicon-germanium (SiGe). For example, the first sacrificial layers SAL1 may include silicon-germanium (SiGe), and the first active layers ACL1 may include silicon (Si). Each of the first sacrificial layers SAL1 may have a germanium concentration of about 10 at % to about 30 at %.

A separation layer DSL may be formed on an uppermost first active layer ACL1. In some example embodiments of the present inventive concepts, the separation layer DSL may have a thickness substantially the same as that of the first sacrificial layer SAL1. In some example embodiments of the present inventive concepts, the separation layer DSL may have a thickness greater than that of the first active layer ACL1 and that of the first sacrificial layer SAL1. The separation layer DSL may include silicon (Si) or silicon-germanium (SiGe). When the separation layer DSL includes silicon-germanium (SiGe), the separation layer DSL may have a germanium concentration greater than that of the first sacrificial layer SAL1. For example, the separation layer DSL may have a germanium concentration of about 40 at % to about 90 at %.

The separation layer DSL may be provided thereon with second sacrificial layers SAL2 and second active layers ACL2 that are alternately stacked. The second sacrificial layers SAL2 may each include the same material as that of the first sacrificial layer SAL1, and the second active layers ACL2 may each include the same material as that of the first active layer ACL1. The separation layer DSL may be interposed between the first sacrificial layer SAL1 and the second sacrificial layer SAL2.

The first and second sacrificial layers SAL1 and SAL2, the first and second active layers ACL1 and ACL2, and the separation layer DSL may be patterned to form a stack pattern STP. The formation of the stack pattern STP may include forming a hardmask pattern on an uppermost second active layer ACL2, and using the hardmask pattern as an etching mask to etch the layers SAL1, SAL2, ACL1, ACL2, and DSL that are stacked on the substrate 100. During the formation of the stack pattern STP, an upper portion of the substrate 100 may be patterned to form a trench TR that defines an active pattern AP. The stack pattern STP may have a bar shape that extends in a second direction D2.

The stack pattern STP may include a lower stack pattern STP1 on the active pattern AP, an upper stack pattern STP2 on the lower stack pattern STP1, and the separation layer DSL between the lower and upper stack patterns STP1 and STP2. The lower stack pattern STP1 may include the first sacrificial layers SAL1 and the first active layers ACL1 that are alternately stacked. The upper stack pattern STP2 may include the second sacrificial layers SAL2 and the second active layers ACL2 that are alternately stacked.

A device isolation layer ST may be formed on the substrate 100, filling the trench TR. For example, a dielectric layer may be formed on an entire surface of the substrate 100, covering the active pattern AP and the stack pattern STP. The dielectric layer may be recessed until the stack pattern STP is exposed, thereby forming the device isolation layer ST.

Figure 7A:
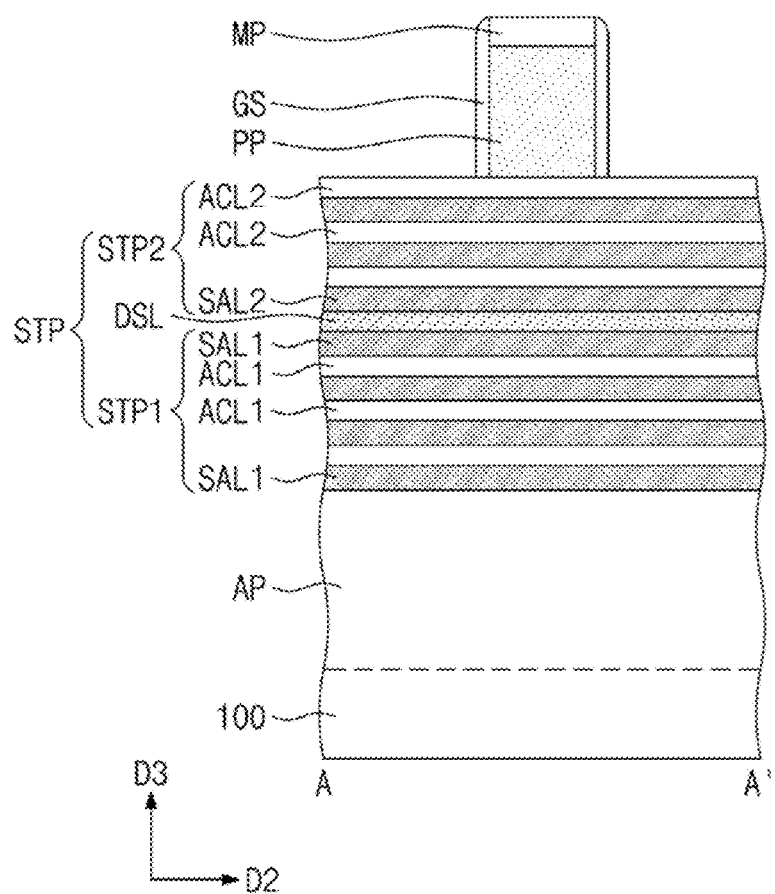
Figure 7B:
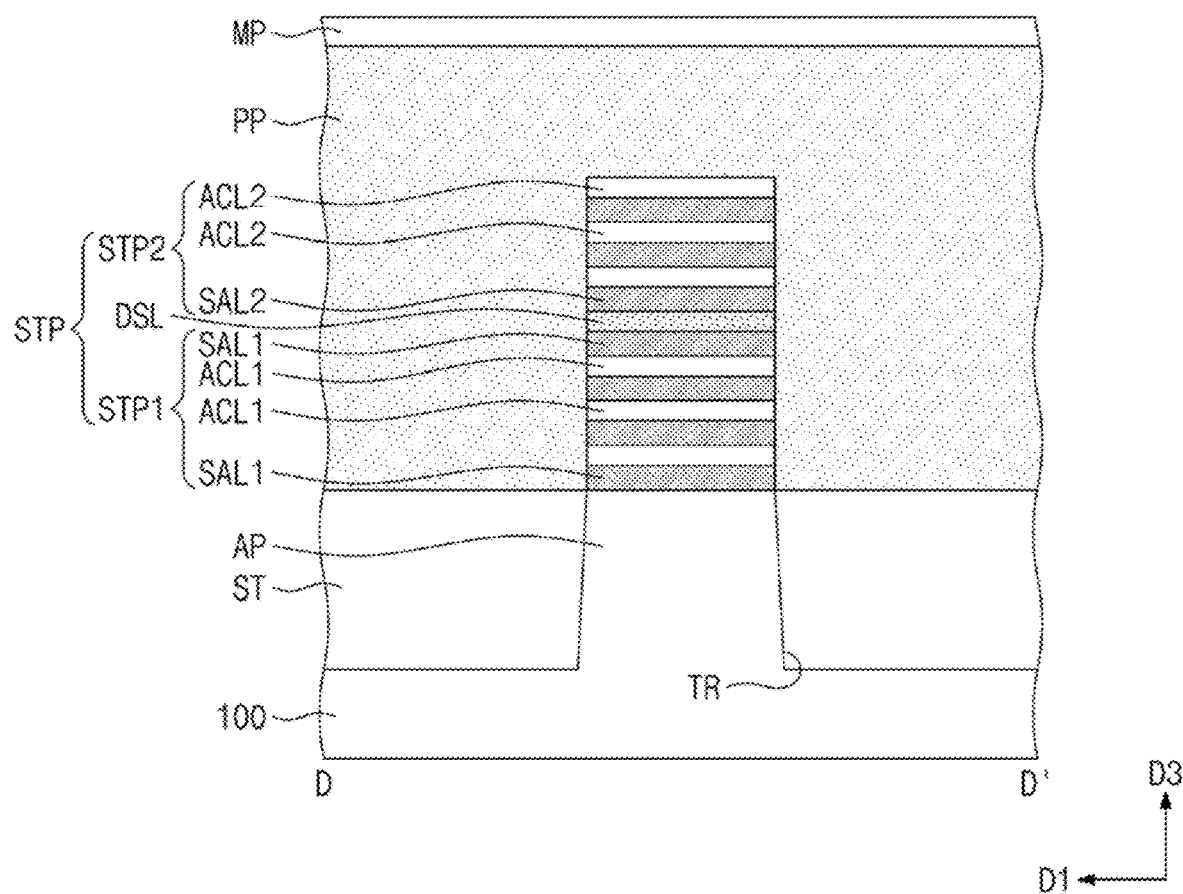

Referring to FIGS. 7A and 7B, a sacrificial pattern PP may be formed to run across the stack pattern STP. The sacrificial pattern PP may be formed to have a linear shape that extends in the first direction D1. For example, the formation of the sacrificial pattern PP may include forming a sacrificial layer on the entire surface of the substrate 100, forming a hardmask pattern MP on the sacrificial layer, and using the hardmask pattern MP as an etching mask to pattern the sacrificial layer. The sacrificial layer may include one or more of amorphous silicon and polysilicon.

A pair of gate spacers GS may be formed on opposite sidewalls of the sacrificial pattern PP. For example, a spacer layer may be conformally formed on the entire surface of the substrate 100. The spacer layer may cover the sacrificial pattern PP and the hardmask pattern MP. For example, the spacer layer may include one or more of SiCN, SiCON, and SiN. The spacer layer may be anisotropically etched to form gate spacers GS.

Figure 8A:
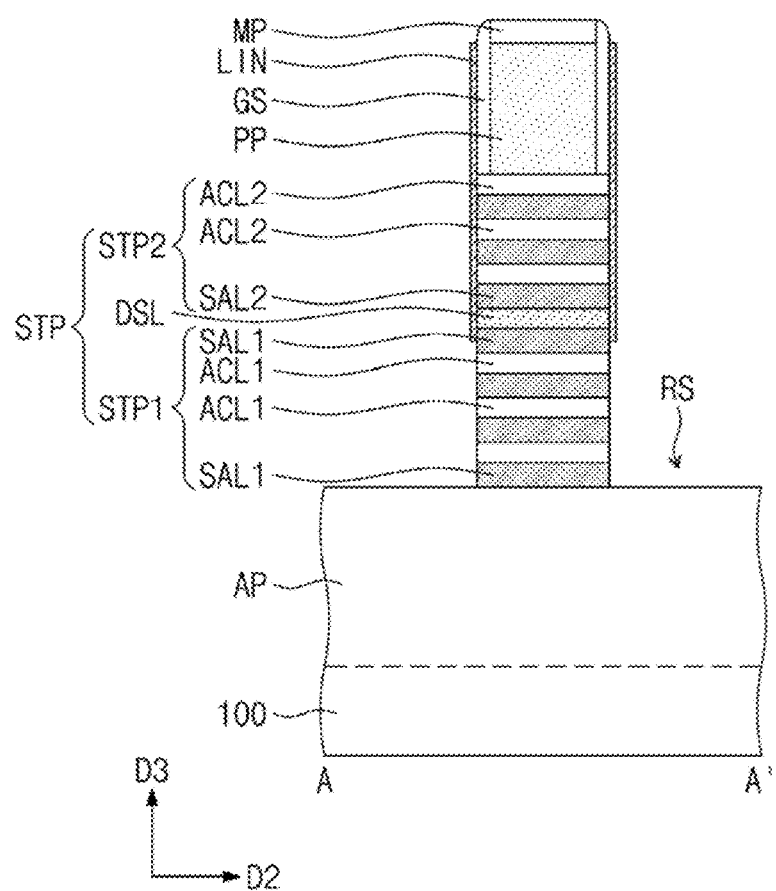
Figure 8B:
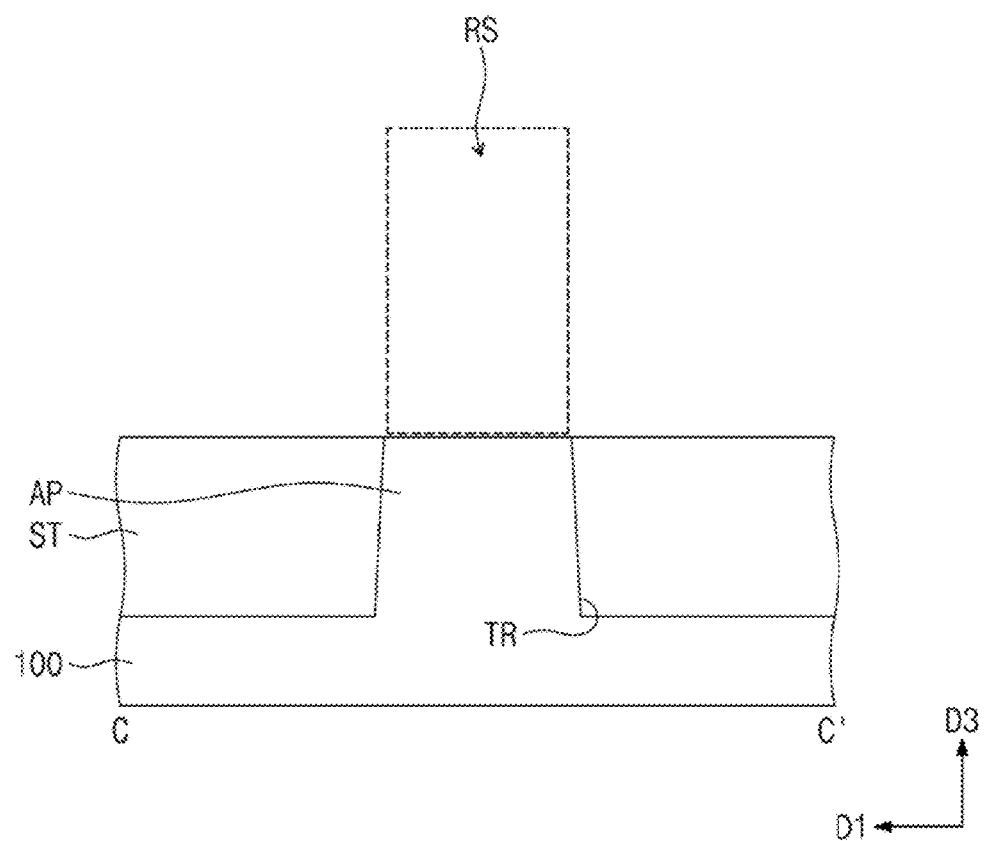

Referring to FIGS. 8A and 8B, the gate spacers GS and the hardmask pattern MP may be used as an etching mask to perform an etching process on the stack pattern STP. The etching process may form a pair of recesses RS on opposite sides of the sacrificial pattern PP.

Liner layers LIN may be formed on opposite sidewalls of the upper stack pattern STP2. The liner layers LIN may not allow the upper stack pattern STP2 to be exposed by the recesses RS. The liner layers LIN may expose the lower stack pattern STP1. For example, the liner layers LIN may include silicon nitride.

Figure 9A:
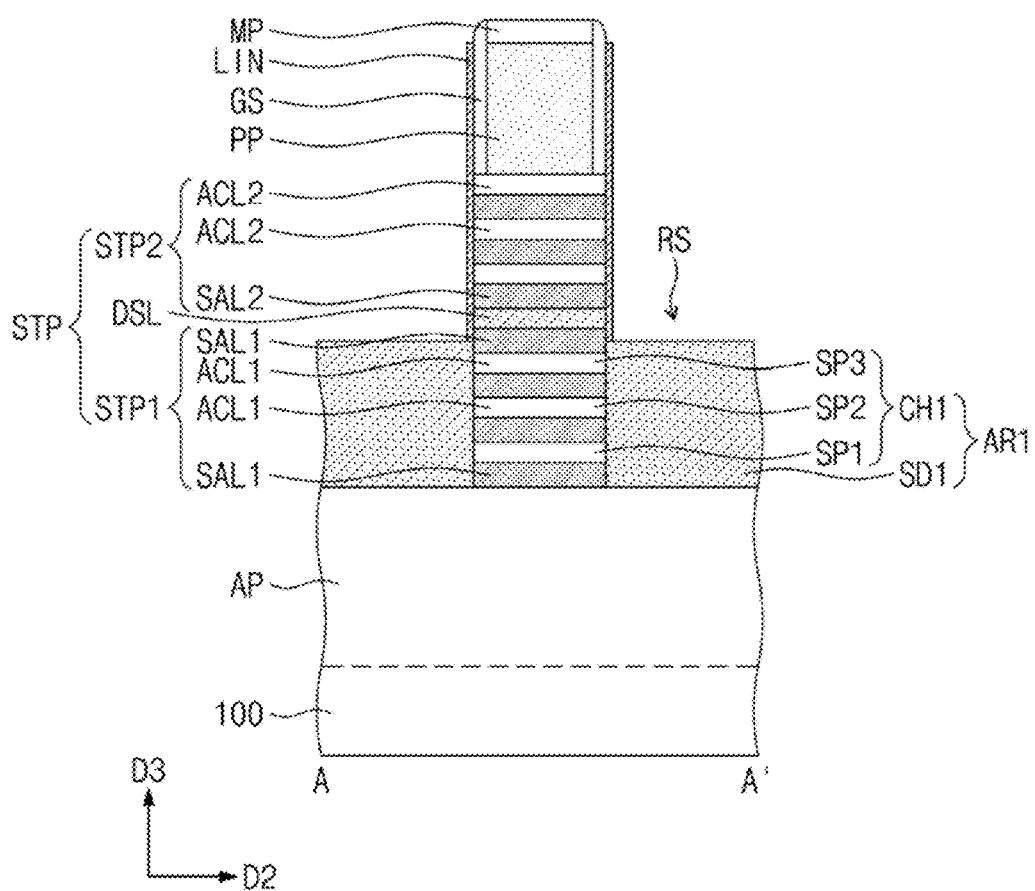
Figure 9B:
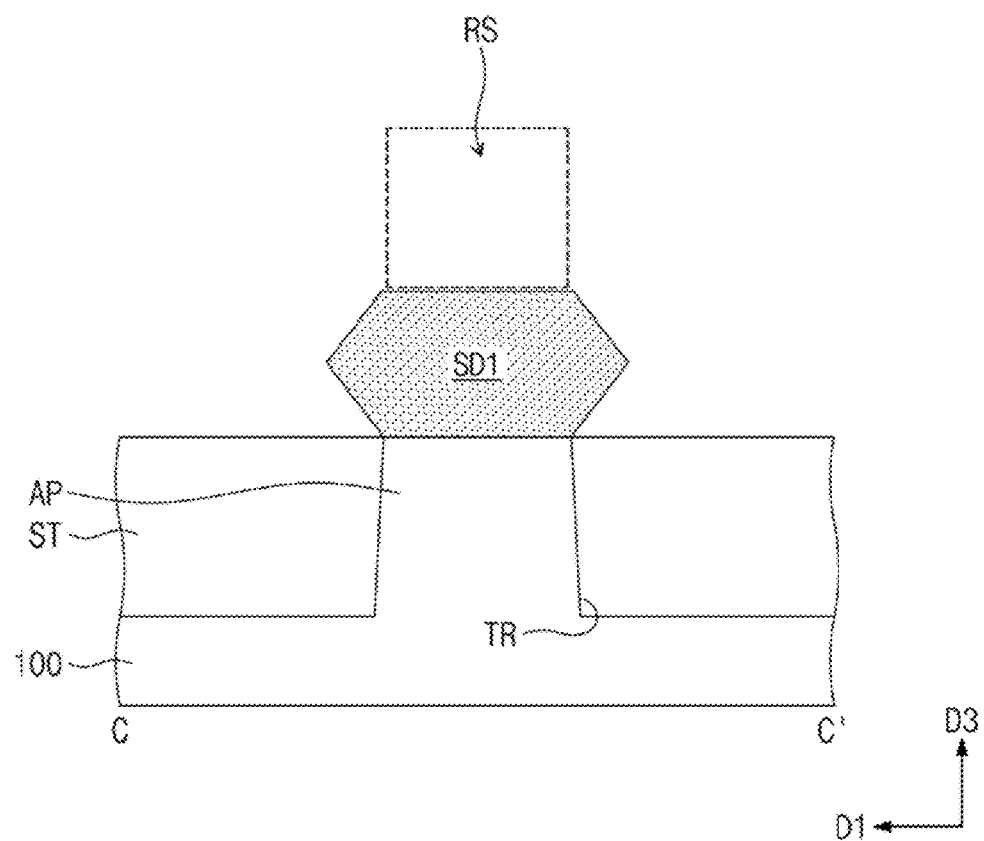

Referring to FIGS. 9A and 9B, lower source/drain patterns SD1 may be formed in corresponding recesses RS. For example, a first selective epitaxial growth (SEG) process may be performed such that the exposed sidewall of the lower stack pattern STP1 may be used as a seed layer to form the lower source/drain pattern SD1. The lower source/drain pattern SD1 may be grown from a seed, or the first active layers ACL1 and the active pattern AP that are exposed by the recess RS. For example, the first SEG process may include chemical vapor deposition (CVD) or molecular beam epitaxy (MBE).

The lower source/drain pattern SD1 may be in-situ doped with impurities during the first SEG process. Alternatively, after the formation of the lower source/drain pattern SD1, impurities may be implanted into the lower source/drain pattern SD1. The lower source/drain pattern SD1 may be doped to have a first conductivity type (e.g., n-type).

A lower channel pattern CH1 may be defined to indicate the first active layers ACL1 interposed between a pair of lower source/drain patterns SD1. For example, the first active layers ACL1 may be formed into first, second, and third semiconductor patterns SP1, SP2, and SP3 of the lower channel pattern CH1. The lower channel pattern CH1 and the lower source/drain patterns SD1 may constitute a first active region AR1 that is a bottom tier of a three-dimensional device.

The sidewall of the upper stack pattern STP2 may be covered with the liner layer LIN. For example, during the first SEG process, the second active layers ACL2 of the upper stack pattern STP2 may not be exposed by the liner layer LIN. Therefore, during the first SEG process, no semiconductor layer may be separately formed on the upper stack pattern STP2.

Figure 10A:
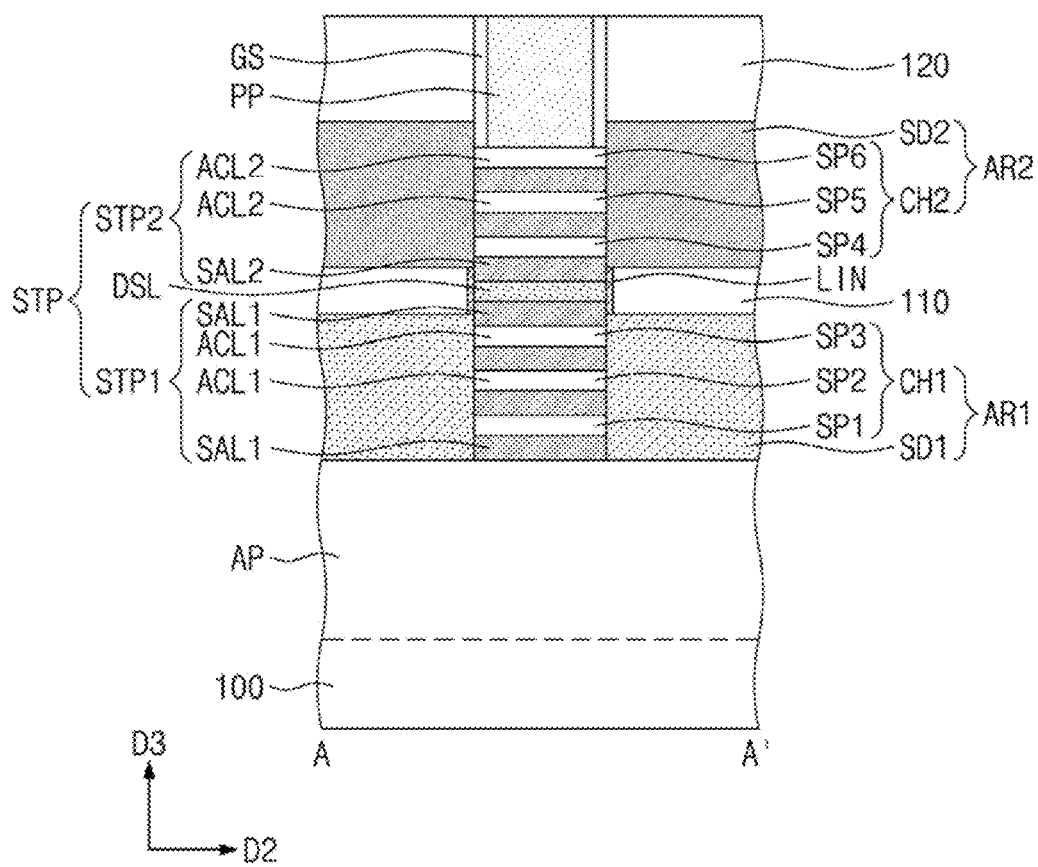
Figure 10B:
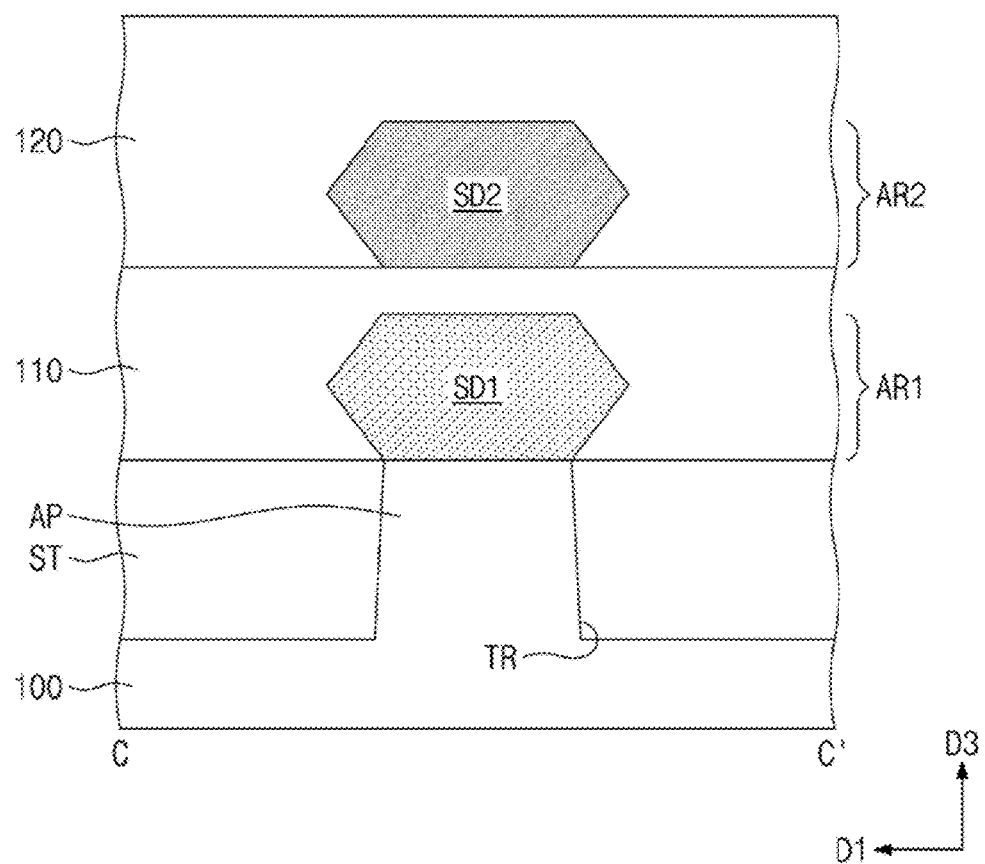

Referring to FIGS. 10A and 10B, a first interlayer dielectric layer 110 may be formed to cover the lower source/drain patterns SD1. The first interlayer dielectric layer 110 may be recessed to have a top surface lower than a bottom surface of a lowermost second active layer ACL2.

The liner layer LIN exposed by the recess RS may be partially removed. The liner layer LIN covered with the first interlayer dielectric layer 110 may cover a sidewall of the separation layer DSL. The removal of the liner layer LIN may allow the recess RS to expose the second active layers ACL2.

Upper source/drain patterns SD2 may be formed on opposite sidewalls of the upper stack pattern STP2. For example, a second SEG process may be performed such that the sidewall of the upper stack pattern STP2 may be used as a seed layer to form the upper source/drain pattern SD2. The upper source/drain pattern SD2 may be grown from a seed, or the second active layers ACL2 exposed by the recess RS. The upper source/drain patterns SD2 may be doped to have a second conductivity type (e.g., p-type) different from the first conductivity type.

An upper channel pattern CH2 may be constituted by the second active layers ACL2 interposed between a pair of upper source/drain patterns SD2. For example, the second active layers ACL2 may be formed into fourth, fifth, and sixth semiconductor patterns SP4, SP5, and SP6 of the upper channel pattern CH2. The upper channel pattern CH2 and the upper source/drain patterns SD2 may constitute a second active region AR2 that is a top tier of a three-dimensional device.

A second interlayer dielectric layer 120 may be formed to cover the hardmask pattern MP, the gate spacers GS, and the upper source/drain patterns SD2. For example, the second interlayer dielectric layer 120 may include a silicon oxide layer.

The second interlayer dielectric layer 120 may be planarized until a top surface of the sacrificial pattern PP is exposed. An etch-back or chemical mechanical polishing (CMP) process may be employed to planarize the second interlayer dielectric layer 120. The hardmask patterns MP may all be removed during the planarization process. As a result, a top surface of the second interlayer dielectric layer 120 may be substantially coplanar with that of the sacrificial pattern PP and those of the gate spacers GS.

Figure 11A:
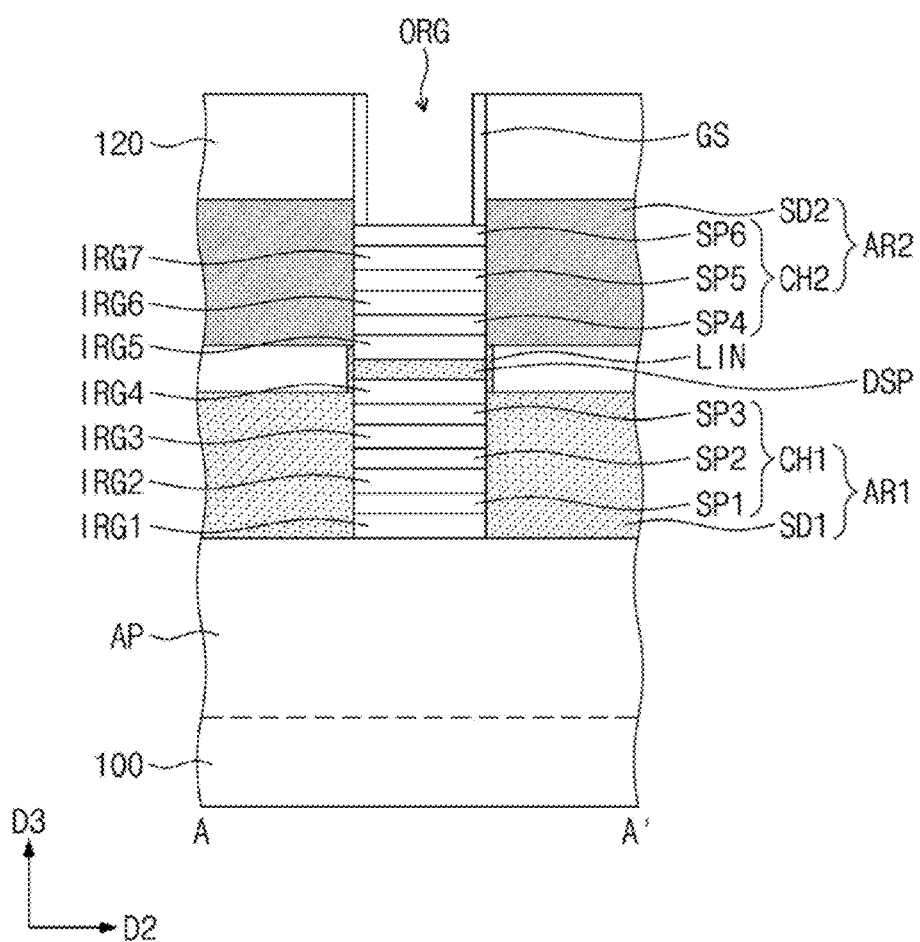
Figure 11B:
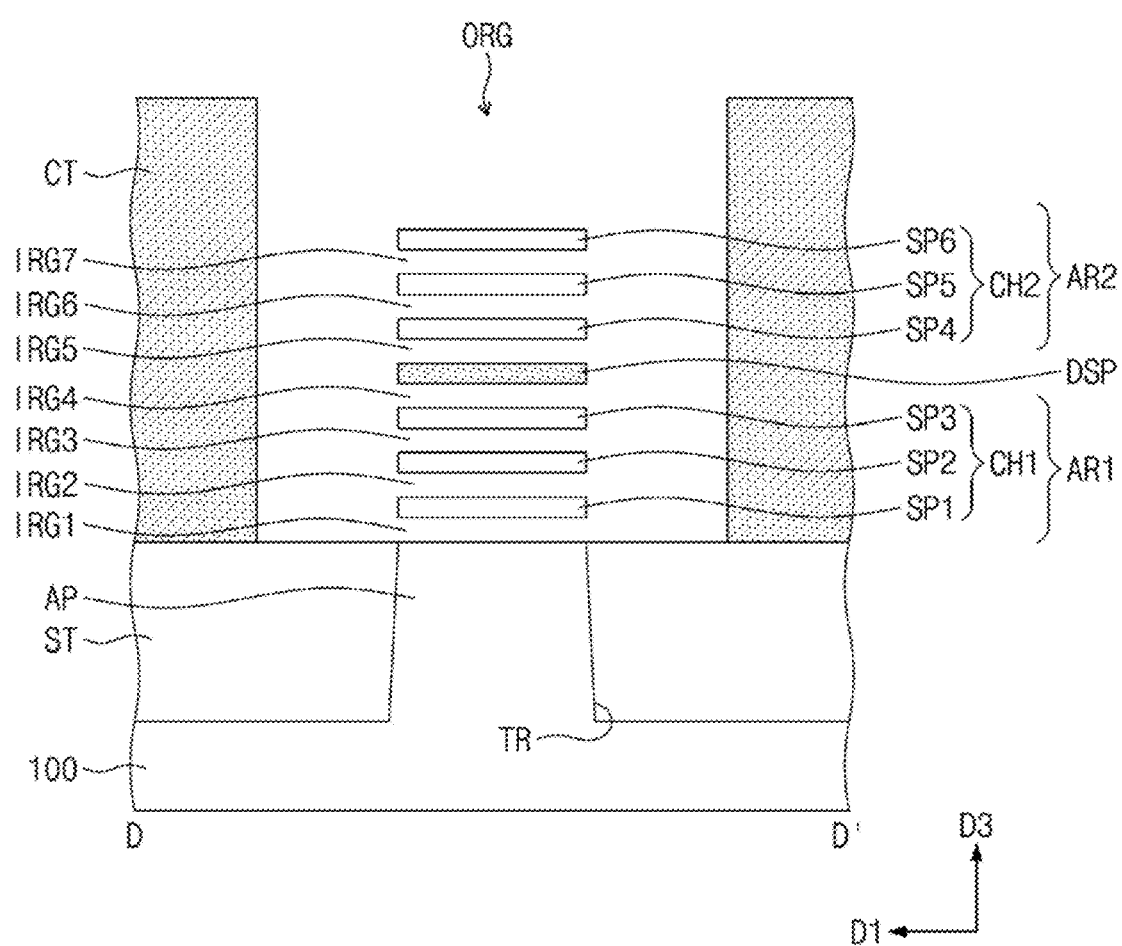

Referring to FIGS. 11A and 11B, a gate cutting pattern CT may be formed to penetrate the sacrificial pattern PP. The gate cutting patterns CT may be formed on first and second cell boundaries CB1 and CB2 of a logic cell. The gate cutting patterns CT may include one or more of a silicon oxide layer and a silicon nitride layer.

The exposed sacrificial pattern PP may be selectively removed. The removal of the sacrificial patterns PP may form an outer region ORG that exposes the lower and upper channel patterns CH1 and CH2 (see FIG. 11B). The removal of the sacrificial pattern PP may include performing a wet etching process using an etchant that selectively etches polysilicon.

In some example embodiments of the present inventive concepts, a dummy channel pattern DSP may replace the separation layer DSL exposed through the outer region ORG. In some example embodiments of the present inventive concepts, the separation layer DSL may remain to constitute the dummy channel pattern DSP.

The first and second sacrificial layers SAL1 and SAL2 exposed to the outer region ORG may be selectively removed to respectively form first to seventh inner regions IRG1 to IRG7 (see FIG. 11B). For example, an etching process may be performed in which the first and second sacrificial layers SAL1 and SAL2 are selectively etched, such that only the first and second sacrificial layers SAL1 and SAL2 may be removed while leaving the dummy channel pattern DSP and the first to sixth semiconductor patterns SP1 to SP6. The etching process may have a high etch rate with respect to silicon-germanium whose germanium concentration is relatively high. For example, the etching process may have a high etch rate with respect to silicon-germanium whose germanium concentration is greater than about 10 at %.

The selective removal of the first and second sacrificial layers SAL1 and SAL2 may cause the first, second, and third semiconductor patterns SP1, SP2, and SP3 to remain on the first active region AR1, and may also cause the fourth, fifth, and sixth semiconductor patterns SP4, SP5, and SP6 to remain on the second active region AR2. The dummy channel pattern DSP may remain between the third semiconductor pattern SP3 and the fourth semiconductor pattern SP4.

The first inner region IRG1 may be defined to indicate an empty space between the active pattern AP and the first semiconductor pattern SP1, the second inner region IRG2 may be defined to indicate an empty space between the first semiconductor pattern SP1 and the second semiconductor pattern SP2, the third inner region IRG3 may be defined to indicate an empty space between the second semiconductor pattern SP2 and the third semiconductor pattern SP3, the fourth inner region IRG4 may be defined to indicate an empty space between the third semiconductor pattern SP3 and the dummy channel pattern DSP, the fifth inner region IRG5 may be defined to indicate an empty space between the dummy channel pattern DSP and the fourth semiconductor pattern SP4, the sixth inner region IRG6 may be defined to indicate an empty space between the fourth semiconductor pattern SP4 and the fifth semiconductor pattern SP5, and the seventh inner region IRG7 may be defined to indicate an empty space between the fifth semiconductor pattern SP5 and the sixth semiconductor pattern SP6.

Figure 12A:
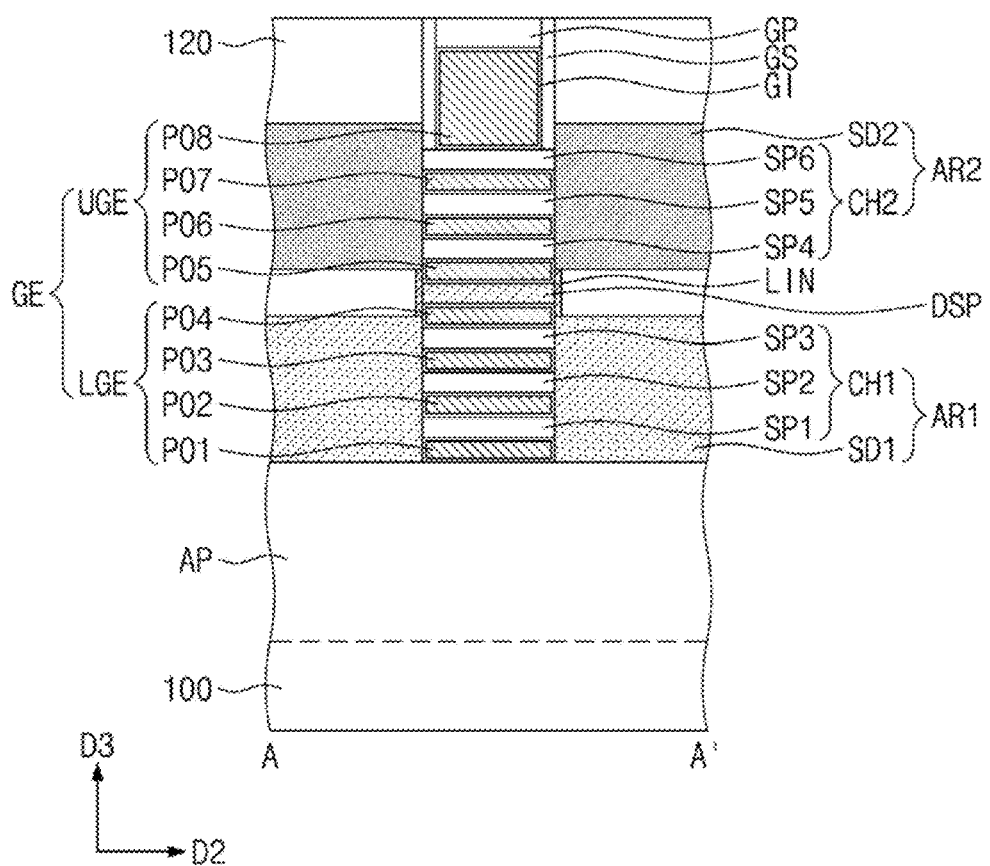
Figure 12B:
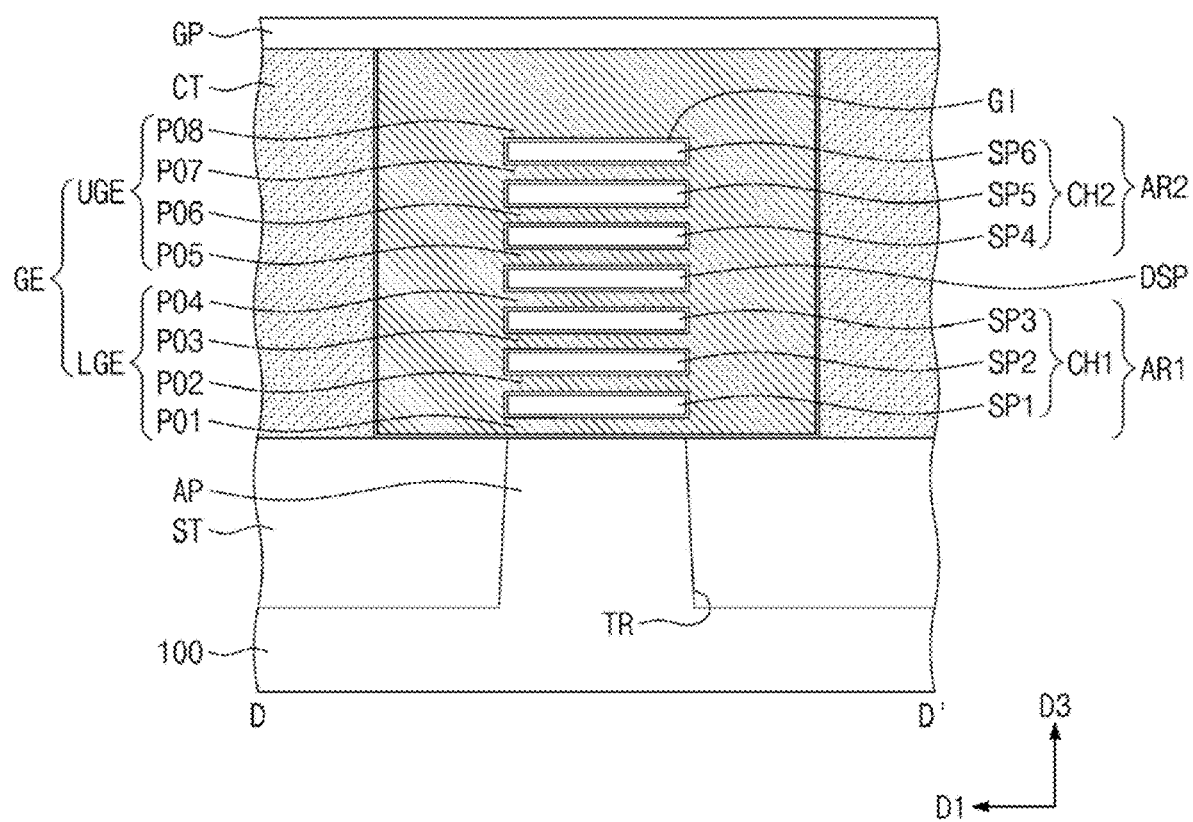

Referring to FIGS. 12A and 12B, a gate dielectric layer GI may be conformally formed on exposed first to sixth semiconductor patterns SP1 to SP6. A gate electrode GE may be formed on the gate dielectric layer GI. The formation of the gate electrode GE may include respectively forming first to seventh portions PO1 to PO7 in the first to seventh inner regions IRG1 to IRG7, and forming an eighth portion PO8 in the outer region ORG.

The gate electrode GE may be recessed to have a reduced height. A gate capping pattern GP may be formed on the recessed gate electrode GE. The gate capping pattern GP may undergo a planarization process to allow the gate capping pattern GP to have a top surface coplanar with that of the second interlayer dielectric layer 120.

Figure 13A:
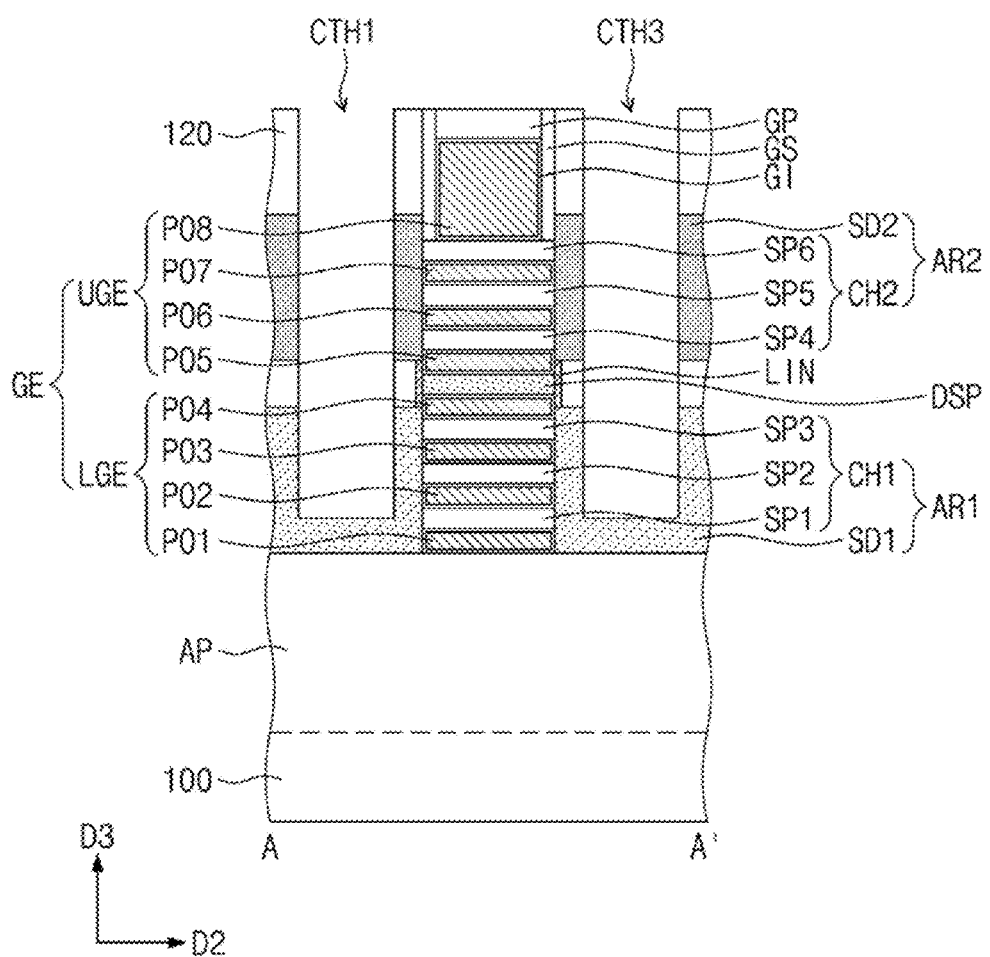
Figure 13B:
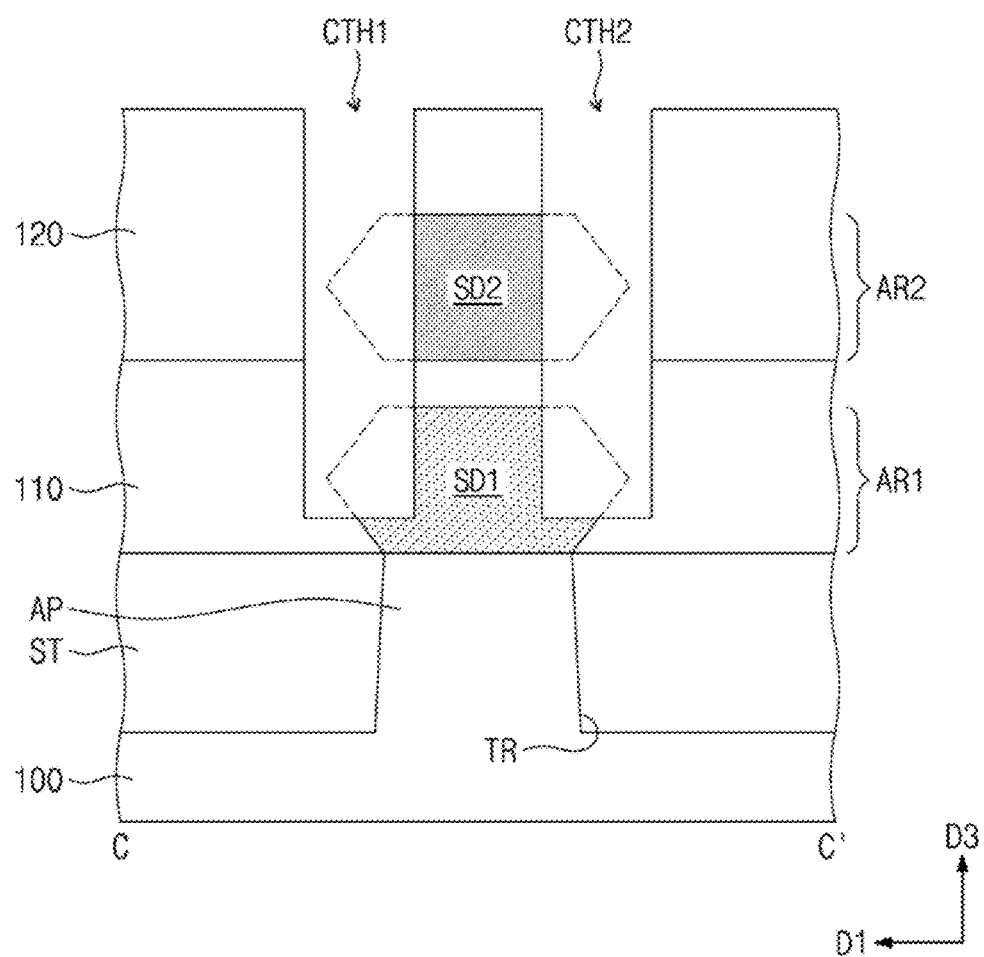

Referring to FIGS. 3, 13A, and 13B, first to fourth contact holes CTH1 to CTH4 may be formed on opposite sides of the gate electrode GE. The first to fourth contact holes CTH1 to CTH4 may respectively correspond to first to fourth active contacts AC1 to AC4 of FIG. 3.

Each of the first to fourth contact holes CTH1 to CTH4 may extend from the top surface of the second interlayer dielectric layer 120 through the upper source/drain pattern SD2 to the lower source/drain pattern SD1. Therefore, the first to fourth contact holes CTH1 to CTH4 may expose the lower and upper source/drain patterns SD1 and SD2.

In some example embodiments, each of the first to fourth contact holes CTH1 to CTH4 may not completely penetrate the lower source/drain pattern SD1. Therefore, each of the first to fourth contact holes CTH1 to CTH4 may have a bottom surface at a level between those of bottom and top surfaces of the lower source/drain pattern SD1. Alternatively, each of the first to fourth contact holes CTH1 to CTH4 may completely penetrate the lower source/drain pattern SD1. Thus, each of the first to fourth contact holes CTH1 to CTH4 may have a bottom surface lower than that of the lower source/drain pattern SD1.

Referring back to FIG. 13B, the first and second contact holes CTH1 and CTH2 may commonly penetrate the lower and upper source/drain patterns SD1 and SD2 that are stacked. For example, both of the first and second contact holes CTH1 and CTH2 may commonly expose the lower source/drain pattern SD1. Both of the first and second contact holes CTH1 and CTH2 may commonly expose the upper source/drain pattern SD2.

Referring to FIGS. 3 and 14A to 14C, sacrificial pillars SFI may be selectively formed only in the second and fourth contact holes CTH2 and CTH4. The sacrificial pillar SFI may be formed in neither the first contact hole CTH1 nor the third contact hole CTH3.

First recess regions RSR1 may be formed by selectively performing a wet etching process on the upper source/drain patterns SD2 that are exposed through the first and third contact holes CTH1 and CTH3. The wet etching process may use an etchant that selectively etches the upper source/drain patterns SD2 other than the lower source/drain patterns SD1. Therefore, the lower source/drain patterns SD1 exposed by the first and third contact holes CTH1 and CTH3 may remain during the wet etching process.

In contrast, because the second and fourth contact holes CTH2 and CTH4 are filled with the sacrificial pillars SFI, the upper source/drain patterns SD2 exposed by the second and fourth contact holes CTH2 and CTH4 may not be etched during the wet etching process.

Referring to FIGS. 3 and 15A to 15C, upper separation structures USS may be selectively formed in corresponding first recess regions RSR1. The formation of the upper separation structures USS may include depositing a dielectric material in the first and third contract holes CTH1 and CTH3, and allowing the dielectric material to undergo an anisotropic etching process on the first and third contact holes CTH1 and CTH3. The upper separation structure USS may be formed to selectively fill the first recess region RSR1.

The sacrificial pillars SFI may be selectively removed from the second contact hole CTH2 and the fourth contact hole CTH4. The sacrificial pillars SFI may be selectively formed in the first contact hole CTH1 and the third contact hole CTH3.

Second recess regions RSR2 may be formed by selectively performing a wet etching process on the lower source/drain patterns SD1 that are exposed through the second and fourth contact holes CTH2 and CTH4. The wet etching process may use an etchant that selectively etches the lower source/drain patterns SD1 other than the upper source/drain patterns SD2. Therefore, the upper source/drain patterns SD2 exposed by the second and fourth contact holes CTH2 and CTH4 may remain during the wet etching process.

In contrast, because the first and third contact holes CTH1 and CTH3 are filled with the sacrificial pillars SFI, the lower source/drain patterns SD1 exposed by the first and third contact holes CTH1 and CTH3 may not be etched during the wet etching process.

Referring to FIGS. 3 and 16A to 16C, lower separation structures LSS may be selectively formed in corresponding second recess regions RSR2. Formation of the lower separation structures LSS may include depositing a dielectric material in the second and fourth contact holes CTH2 and CTH4, and allowing the dielectric material to undergo an anisotropic etching process on the second and fourth contact holes CTH2 and CTH4. The lower separation structure LSS may be formed to selectively fill the second recess region RSR2. Afterwards, the sacrificial pillars SFI may be selectively removed from the first contact hole CTH1 and the third contact hole CTH3.

The first to fourth contact holes CTH1 to CTH4 may be filled with a conductive material to form first to fourth active contacts AC1 to AC4. According to some example embodiments, a single process may be formed to simultaneously form the first to fourth contact holes CTH1 to CTH4 that define the first to fourth active contacts AC1 to AC4. The first to fourth active contacts AC1 to AC4 may be simultaneously formed in one process in which the first to fourth contact holes CTH1 to CTH4 are filled with a conductive material. Nevertheless, in the present inventive concepts, the lower and upper separation structures LSS and USS may be used such that the first to fourth active contacts AC1 to AC4 may be selectively connected to four source/drain terminals of stacked transistors.

Referring back to FIGS. 3 and 4A to 4D, a third interlayer dielectric layer 130 may be formed on the second interlayer dielectric layer 120. A gate contact GC may be formed to penetrate the third interlayer dielectric layer 130 and the gate capping pattern GP and to connect to the gate electrode GE. In the third interlayer dielectric layer 130, connection lines CNL may be formed to connect to the first to fourth active contacts AC1 to AC4.

A fourth interlayer dielectric layer 140 may be formed on the third interlayer dielectric layer 130. A first metal layer M1 may be formed in the fourth interlayer dielectric layer 140. The formation of the first metal layer M1 may include forming first to third wiring lines MI1 to MI3 in an upper portion of the fourth interlayer dielectric layer 140.

A via VI may be formed below each of the first to third wiring lines MI1 to MI3. For example, the vias VI may be formed before the formation of the first to third wiring lines MI1 to MI3. For another example, the vias VI together with the first to third wiring lines MI1 to MI3 may be formed by a dual damascene process.

Although not shown, additional metal layers (e.g., M2, M3, M4, etc.) may be formed on the first metal layer M1. The first metal layer M1 and other metal layers (e.g., M2, M3, M4, etc.) on the first metal layer M1 may constitute a back-end-of-line (BEOL) layer of a semiconductor device.

Figure 17A:
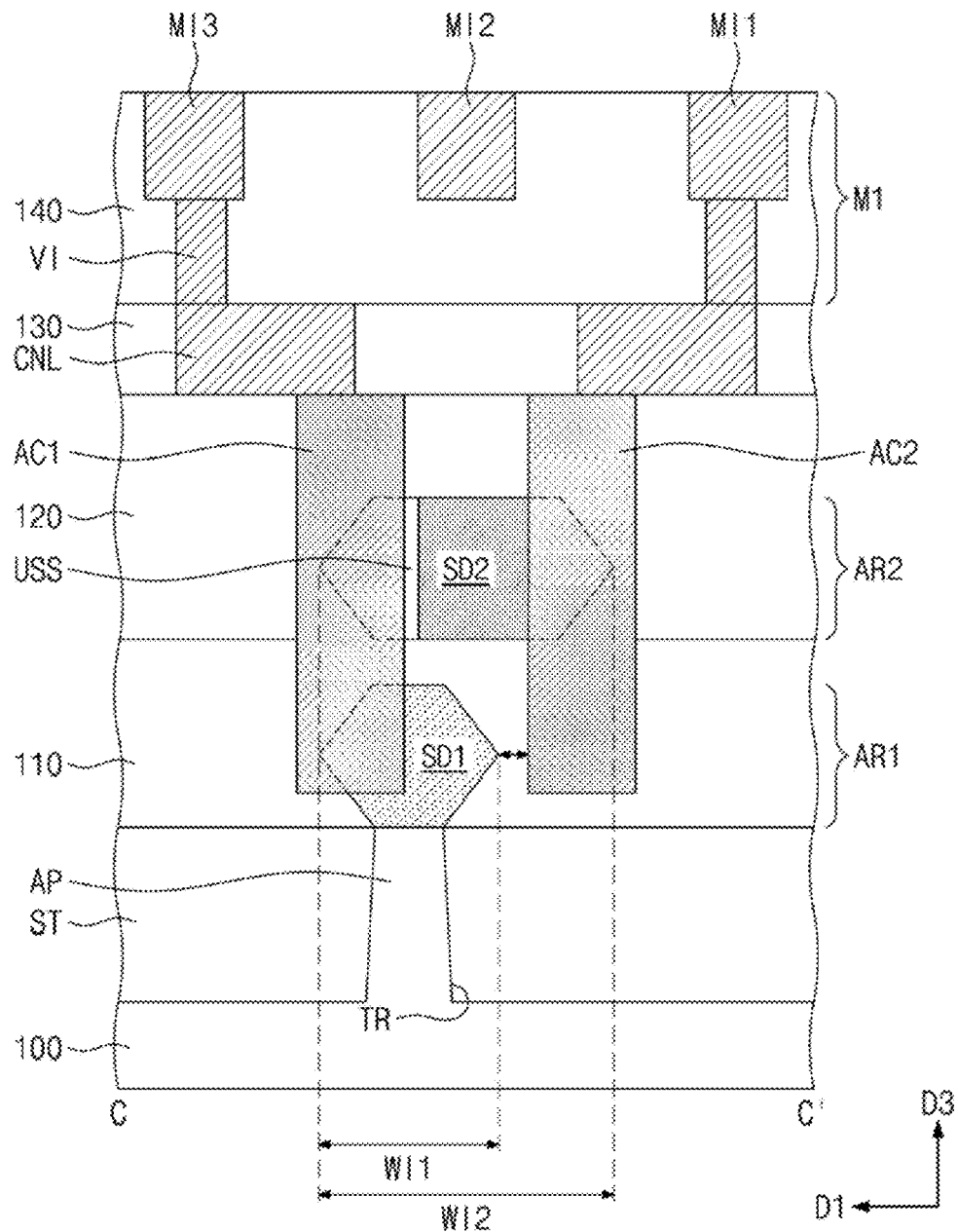
FIGS. 17A and 17B illustrate cross-sectional views respectively taken along lines C-C' and D-D' of FIG. 3, showing a three-dimensional semiconductor device according to some example embodiments of the present inventive concepts.
Figure 17B:
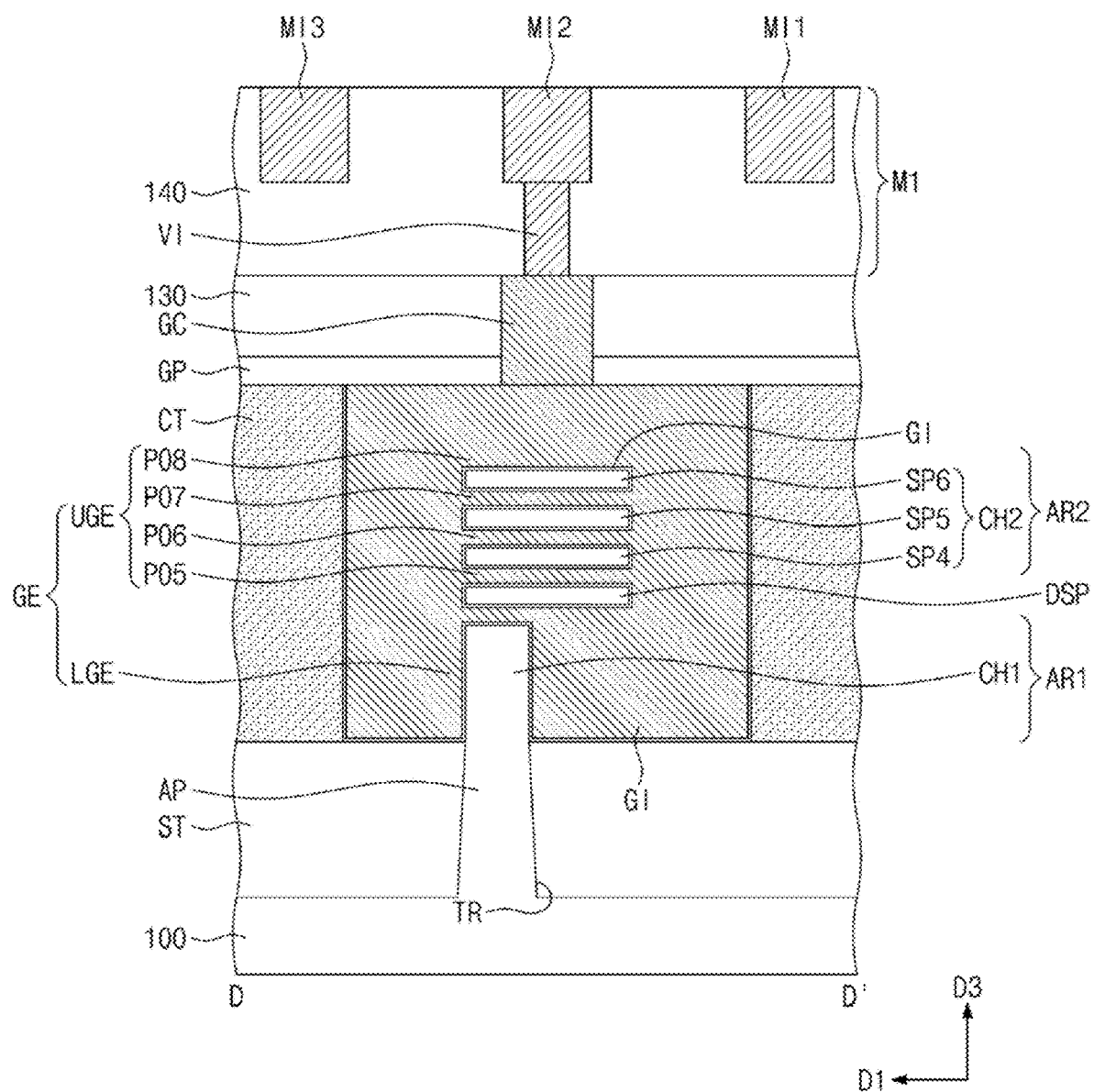

FIGS. 17A and 17B illustrate cross-sectional views respectively taken along lines C-C' and D-D' of FIG. 3, showing a three-dimensional semiconductor device according to some example embodiments of the present inventive concepts. In the description of some example embodiments, including the example embodiments shown in FIGS. 17A and 17B that follows, a detailed description of technical features repetitive to those discussed above with reference to FIGS. 3 and 4A to 4D will be omitted, and a difference thereof will be discussed in detail.

Referring to FIGS. 17A and 17B, a maximum width WI1 of the lower source/drain pattern SD1 may be different from a maximum width WI2 of the upper source/drain pattern SD2. For example, the maximum width WI1 of the lower source/drain pattern SD1 may be less than the maximum width WI2 of the upper source/drain pattern SD2. The lower source/drain pattern SD1 may be offset in the first direction D1 from the upper source/drain pattern SD2.

In some example embodiments, a lower transistor of the first active region AR1 may be FinFET. An upper transistor of the second active region AR2 may be an MBCFET (or CAAFET). For example, the lower channel pattern CH1 may have a fin shape that vertically protrudes from the active pattern AP. The lower gate electrode LGE may be provided on a top surface and opposite sidewalls of the lower channel pattern CH1 (see FIG. 17B).

The first active contact AC1 may penetrate the upper source/drain pattern SD2 to be coupled to the lower source/drain pattern SD1. The upper separation structure USS may be interposed between the upper source/drain pattern SD2 and the first active contact AC1.

The second active contact AC2 may penetrate the upper source/drain pattern SD2 to extend downwardly adjacent to the lower source/drain pattern SD1. The lower source/drain pattern SD1 may have a width less than that of the upper source/drain pattern SD2, and may be offset in the first direction D1 from the upper source/drain pattern SD2. Therefore, the lower source/drain pattern SD1 may not be in contact with, but may be horizontally spaced apart from the second active contact AC2. The first interlayer dielectric layer 110 may be interposed between the lower source/drain pattern SD1 and the second active contact AC2.

Figure 18:
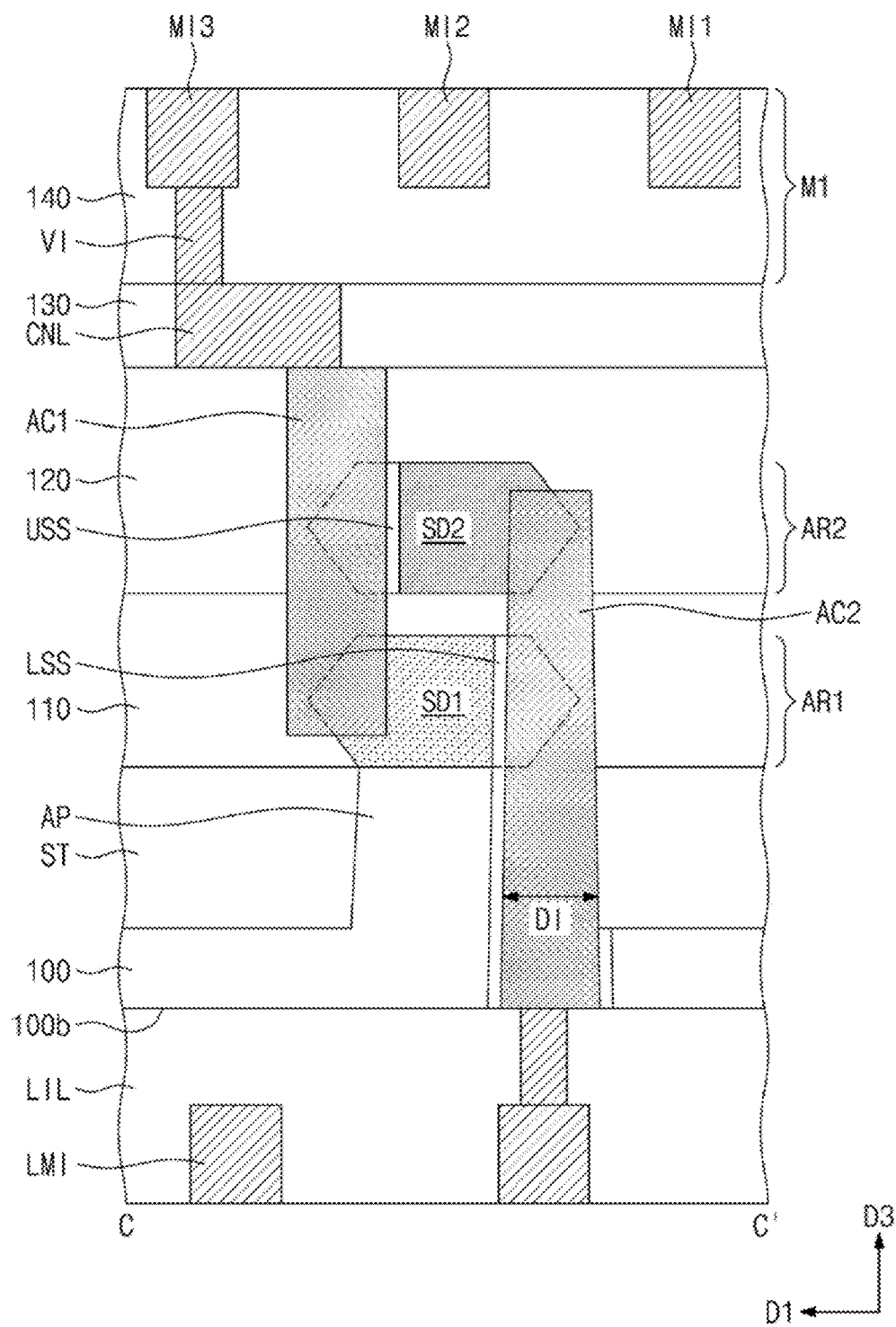
FIGS. 18 and 19 illustrate cross-sectional views each taken along line C-C' of FIG. 3, showing a three-dimensional semiconductor device according to some example embodiments of the present inventive concepts.
Figure 19:
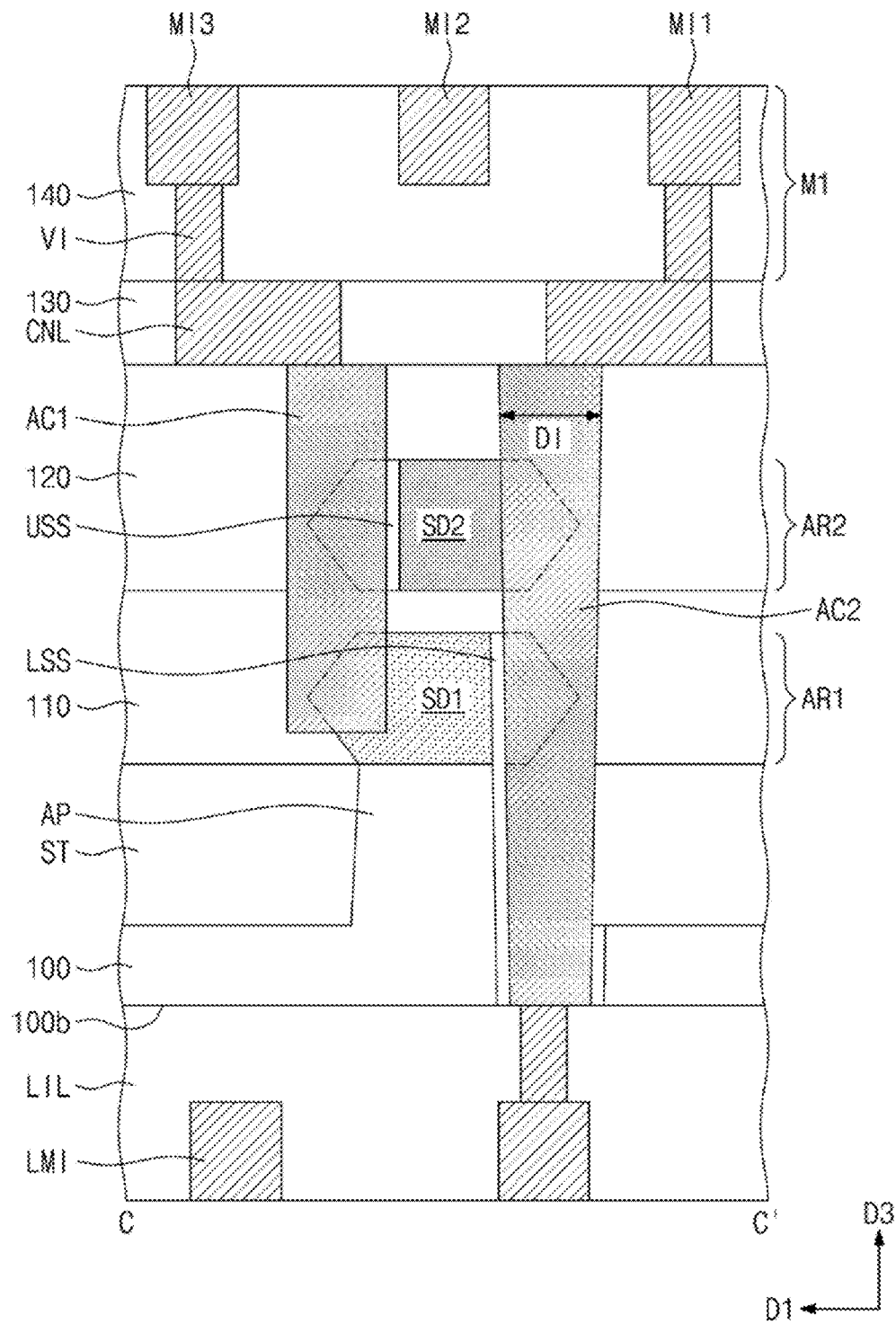

FIGS. 18 and 19 illustrate cross-sectional views each taken along line C-C' of FIG. 3, showing a three-dimensional semiconductor device according to some example embodiments of the present inventive concepts. In the description of some example embodiments, including the example embodiments shown in FIGS. 18 and 19 that follows, a detailed description of technical features repetitive to those discussed above with reference to FIGS. 3 and 4A to 4D will be omitted, and a difference thereof will be discussed in detail.

Referring to FIG. 18, a lower dielectric layer LIL may be provided on a bottom surface 100b of the substrate 100. A lower metal layer BSI may be provided in the lower dielectric layer LIL. The lower metal layer BSI may include a plurality of lower wiring lines LMI.

The second active contact AC2 may extend in the third direction D3 from the bottom surface 100b of the substrate 100. The second active contact AC2 may penetrate the lower source/drain pattern SD1 to be coupled to the upper source/drain pattern SD2. The lower separation structure LSS may be interposed between the second active contact AC2 and the lower source/drain pattern SD1 and between the second active contact AC2 and the substrate 100.

The second active contact AC2 may be electrically connected to one of the plurality of lower wiring lines LMI included in the lower metal layer BSI. The second active contact AC2 may have a diameter DI that decreased in the third direction D3. For example, the diameter DI of the second active contact AC2 may decrease in a direction away from the bottom surface 100b of the substrate 100 in the third direction D3.

Referring to FIG. 19, the second active contact AC2 may extend from the top surface of the second interlayer dielectric layer 120 toward the bottom surface 100b of the substrate 100. The second active contact AC2 may penetrate the upper source/drain pattern SD2, the lower source/drain pattern SD1, and the substrate 100. An upper portion of the second active contact AC2 may be electrically connected to the first wiring line MI1 of the first metal layer M1. A sidewall of the second active contact AC2 may be connected to the upper source/drain pattern SD2. A lower portion of the second active contact AC2 may be electrically connected to one of the plurality of lower wiring lines LMI included in the lower metal layer BSI. For example, the upper source/drain pattern SD2 may be connected through the second active contact AC2 to both of the first wiring line MI1 and the lower wiring line LMI.

The present inventive concepts may provide a three-dimensional device in which an NMOSFET and a PMOSFET are vertically stacked to increase integration of device. In the present inventive concepts, source/drain terminals of the NMOSET and PMOSFET may be selectively and simultaneously connected to corresponding active contacts that are formed in the same shape. Therefore, the three-dimensional device may increase in reliability and decrease in process difficulty in forming the active contacts.

Although the present inventive concepts have been described in connection with the some example embodiments of the present inventive concepts illustrated in the accompanying drawings, it will be understood by one of ordinary skill in the art that variations in form and detail may be made therein without departing from the spirit and essential feature of the present inventive concepts. The above example embodiments should thus be considered illustrative and not restrictive.

What is claimed is:

1. A three-dimensional semiconductor device, comprising:
   a first active region on a substrate, the first active region including a lower channel pattern and a lower source/drain pattern connected to the lower channel pattern;
   a second active region stacked on the first active region, the second active region including an upper channel pattern and an upper source/drain pattern connected to the upper channel pattern;
   a gate electrode on the lower channel pattern and the upper channel pattern;
   a first active contact electrically connected to the lower source/drain pattern;
   an upper separation structure between the first active contact and the upper source/drain pattern;
   a second active contact electrically connected to the upper source/drain pattern; and
   a lower separation structure that is distinct from the upper separation structure and between the second active contact and the lower source/drain pattern,
   wherein the upper separation structure is in contact with a sidewall of the first active contact,
   wherein the upper separation structure is spaced apart from the second active contact,
   wherein the lower separation structure is in contact with a sidewall and bottom surface of the second active contact, and
   wherein the lower separation structure is spaced apart from the first active contact.

2. The three-dimensional semiconductor device of claim 1, wherein
   the gate electrode extends in a first direction,
   the lower and upper source/drain patterns are adjacent to one side of the gate electrode, and
   the first and second active contacts are adjacent to each other in the first direction.

3. The three-dimensional semiconductor device of claim 1, further comprising:
an interlayer dielectric layer that covers the lower and upper source/drain patterns,
wherein the first and second active contacts extend from a top surface of the interlayer dielectric layer through the upper source/drain pattern toward the lower source/drain pattern,
wherein the upper separation structure is configured to isolate the first active contact from direct contact with the upper source/drain pattern, and
wherein the lower separation structure is configured to isolate the second active contact from direct contact with the lower source/drain pattern.

4. The three-dimensional semiconductor device of claim 1, wherein a bottom surface of the first active contact is at a level that is a substantially same level as a level of a bottom surface of the second active contact.

5. The three-dimensional semiconductor device of claim 4, wherein the bottom surface of the first active contact and the bottom surface of the second active contact are between a top surface and a bottom surface of the lower source/drain pattern.

6. The three-dimensional semiconductor device of claim 1, wherein the first and second active contacts have a substantially same pillar shape.

7. The three-dimensional semiconductor device of claim 1, wherein
each of the lower and upper channel patterns includes a plurality of semiconductor patterns that are vertically stacked and spaced apart from each other, and
the gate electrode surrounds the plurality of semiconductor patterns.

8. The three-dimensional semiconductor device of claim 1, further comprising a dummy channel pattern between the lower channel pattern and the upper channel pattern,
wherein the dummy channel pattern includes a semiconductor material or a silicon-based dielectric material.

9. The three-dimensional semiconductor device of claim 1, further comprising a plurality of wiring lines on the first and second active contacts,
wherein the wiring lines are electrically connected to the first and second active contacts.

10. The three-dimensional semiconductor device of claim 1, further comprising:
a metal layer on the first active contact; and
a lower metal layer on a bottom surface of the substrate,
wherein the metal layer includes a first wiring line electrically connected to the first active contact, and
wherein the lower metal layer includes a second wiring line electrically connected to the second active contact.

11. A three-dimensional semiconductor device, comprising:
a first active region on a substrate, the first active region including a lower channel pattern and a pair of first and second lower source/drain patterns on opposite sides of the lower channel pattern;
a second active region on the first active region, the second active region including an upper channel pattern and a pair of first and second upper source/drain patterns on opposite sides of the upper channel pattern;
a gate electrode on the lower channel pattern and the upper channel pattern;
a first active contact electrically connected to the first lower source/drain pattern;
a second active contact electrically connected to the first upper source/drain pattern;
a third active contact electrically connected to the second lower source/drain pattern; and
a fourth active contact electrically connected to the second upper source/drain pattern,
wherein each of the first and second active contacts extends through the first upper source/drain pattern and extends at least partially through the first lower source/drain pattern, and
wherein the third and fourth active contacts penetrate the second upper source/drain pattern and vertically extend to the second lower source/drain pattern.

12. The three-dimensional semiconductor device of claim 11, further comprising:
a first upper separation structure between the first active contact and the first upper source/drain pattern;
a first lower separation structure between the second active contact and the first lower source/drain pattern;
a second upper separation structure between the third active contact and the second upper source/drain pattern; and
a second lower separation structure between the fourth active contact and the second lower source/drain pattern.

13. The three-dimensional semiconductor device of claim 11, wherein
the lower channel pattern has a fin shape that vertically protrudes from the substrate, and
the upper channel pattern includes a plurality of semiconductor patterns that are vertically stacked and spaced apart from each other.

14. The three-dimensional semiconductor device of claim 11, wherein bottom surfaces of the first to fourth active contacts are at a substantially same level.

15. The three-dimensional semiconductor device of claim 11, wherein the first to fourth active contacts have a substantially same pillar shape.

16. A three-dimensional semiconductor device, comprising:
a substrate that includes an active pattern;
a lower source/drain pattern on the active pattern;
an upper source/drain pattern stacked on the lower source/drain pattern, the upper source/drain pattern being vertically spaced apart from the lower source/drain pattern, and the lower and upper source/drain patterns vertically overlapping each other;
an interlayer dielectric layer that covers the lower and upper source/drain patterns;
first and second active contacts that vertically extend from a top surface of the interlayer dielectric layer through the upper source/drain pattern toward the lower source/drain pattern;
an upper separation structure between the first active contact and the upper source/drain pattern; and
a lower separation structure that is distinct from the upper separation structure, the lower separation structure between the second active contact and the lower source/drain pattern,
wherein the first active contact is insulated from the upper source/drain pattern and electrically connected to the lower source/drain pattern,
wherein the second active contact is insulated from the lower source/drain pattern and electrically connected to the upper source/drain pattern,
wherein the upper separation structure is in contact with a sidewall of the first active contact,
wherein the upper separation structure is spaced apart from the second active contact, wherein the lower separation structure is in contact with a sidewall and bottom surface of the second active contact, and wherein the lower separation structure is spaced apart from the first active contact.

17. The three-dimensional semiconductor device of claim 16, wherein a bottom surface of each of the first and second active contacts is at a level between respective levels of top and bottom surfaces of the lower source/drain pattern.

18. The three-dimensional semiconductor device of claim 16, further comprising a plurality of wiring lines on the interlayer dielectric layer, wherein the wiring lines are electrically connected to the first and second active contacts.

19. The three-dimensional semiconductor device of claim 16, wherein a maximum width of the lower source/drain pattern is less than a maximum width of the upper source/drain pattern, and the second active contact is horizontally spaced apart from the lower source/drain pattern.

20. The three-dimensional semiconductor device of claim 16, wherein the first and second active contacts have a substantially same pillar shape.

\* \* \* \* \*